US007687859B2

(12) United States Patent
Russ et al.

(10) Patent No.: US 7,687,859 B2
(45) Date of Patent: Mar. 30, 2010

(54) ELECTRONIC CIRCUIT AND METHOD OF MANUFACTURING AN ELECTRONIC CIRCUIT

(75) Inventors: Christian Russ, Diedorf (DE); David Trémouilles, Heverlee (BE); Steven Thijs, Willebroek (BE)

(73) Assignees: Infineon Technologies AG, Neubiberg (DE); IMEC VZW., Leuven (BE)

( * ) Notice: Subject to any disclaimer, the term of this patent is extended or adjusted under 35 U.S.C. 154(b) by 130 days.

(21) Appl. No.: 11/852,068

(22) Filed: Sep. 7, 2007

(65) Prior Publication Data

US 2009/0065868 A1    Mar. 12, 2009

(51) Int. Cl.
*H01L 23/62* (2006.01)

(52) U.S. Cl. .............................. 257/357; 257/E21.409; 257/E29.345; 257/E27.112; 257/351; 257/355

(58) Field of Classification Search ................. 257/351, 257/347, 360, 336; 438/157
See application file for complete search history.

(56) References Cited

U.S. PATENT DOCUMENTS

| 6,187,619 | B1* | 2/2001 | Wu ........................... 438/224 |
| 6,657,259 | B2 | 12/2003 | Fried et al. |
| 6,815,277 | B2 | 11/2004 | Fried et al. |
| 7,042,009 | B2 | 5/2006 | Shaheen et al. |
| 7,208,815 | B2 | 4/2007 | Chen et al. |
| 2006/0214226 | A1 | 9/2006 | Chen et al. |

* cited by examiner

*Primary Examiner*—Fernando L Toledo
*Assistant Examiner*—Mamadou Diallo
(74) *Attorney, Agent, or Firm*—Slater & Matsil, L.L.P.

(57) ABSTRACT

An electronic circuit includes at least one field effect transistor that is to be protected against electrostatic discharge events, and at least one protection field effect transistor. The protection field effect transistor has a crystal orientation that is different from a crystal orientation of the field effect transistor to be protected.

25 Claims, 17 Drawing Sheets

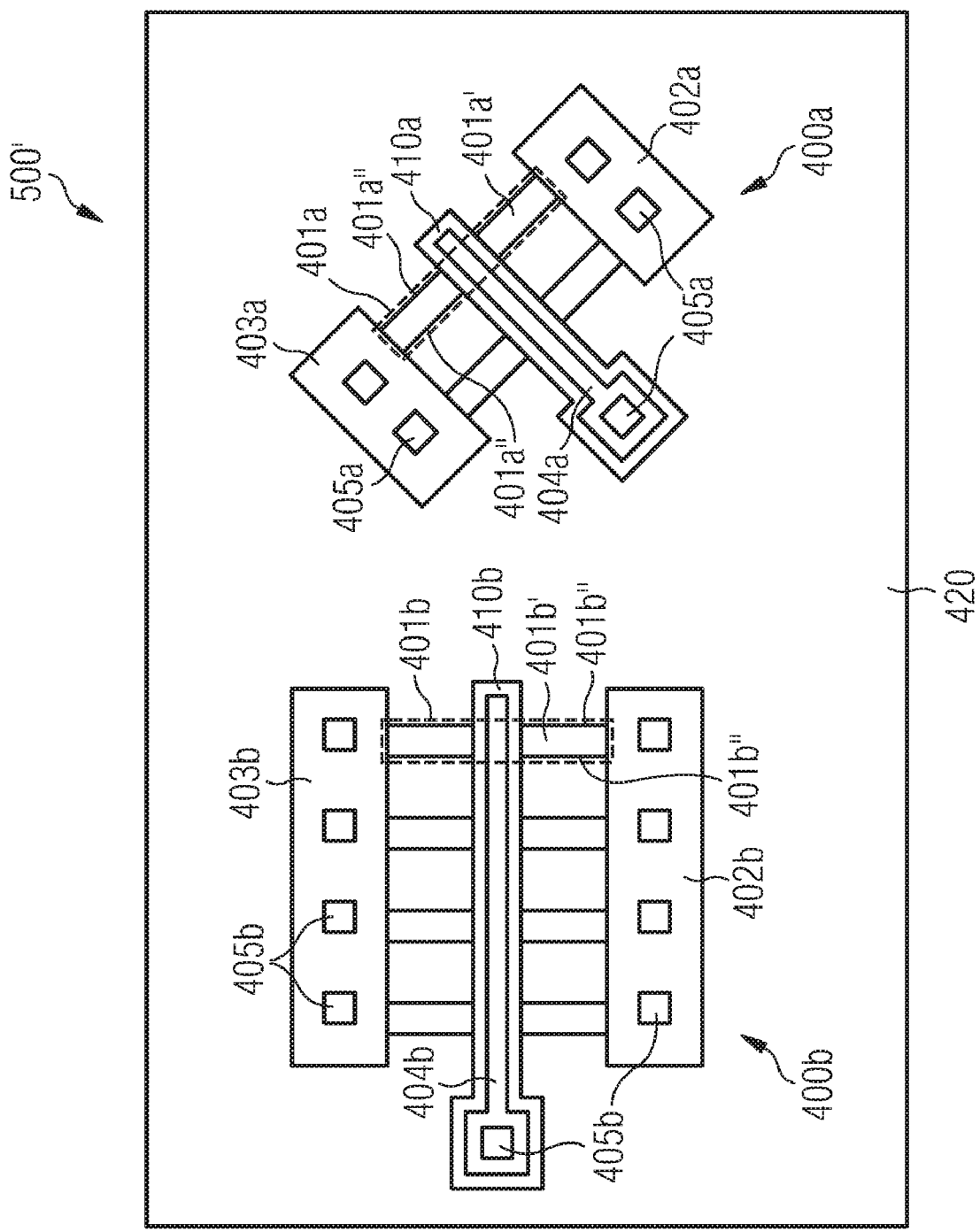
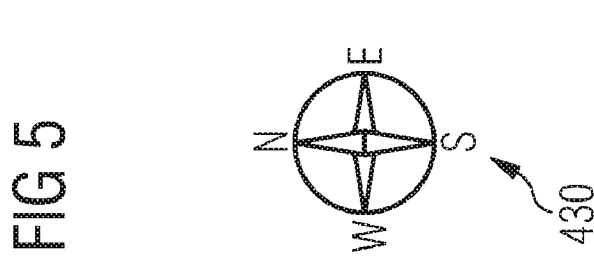
FIG 5

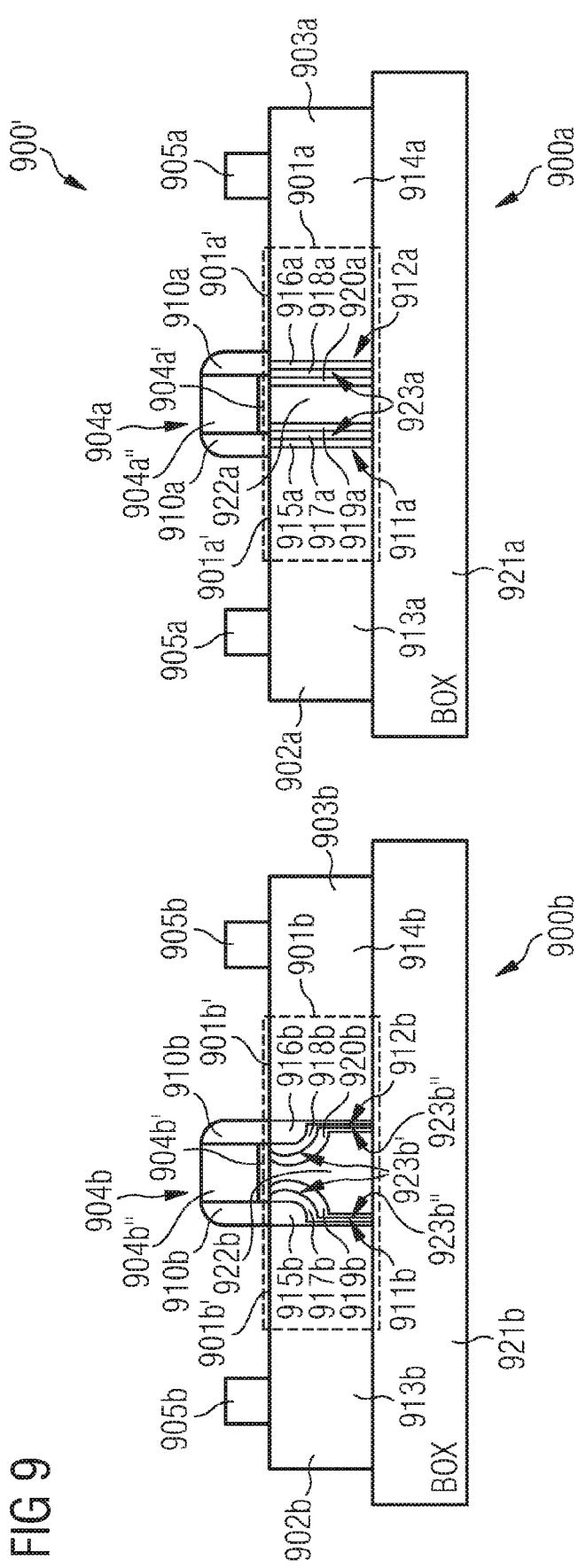

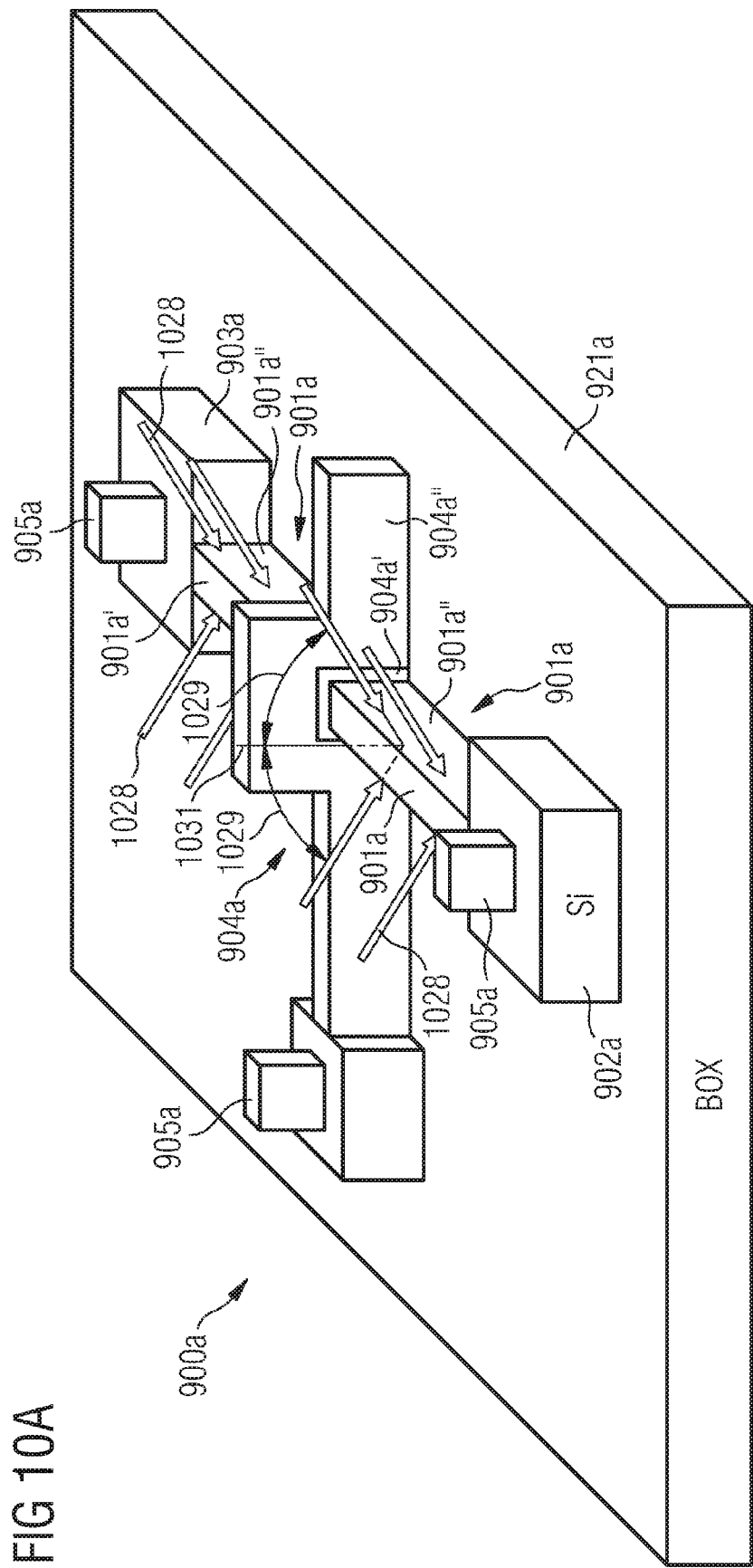

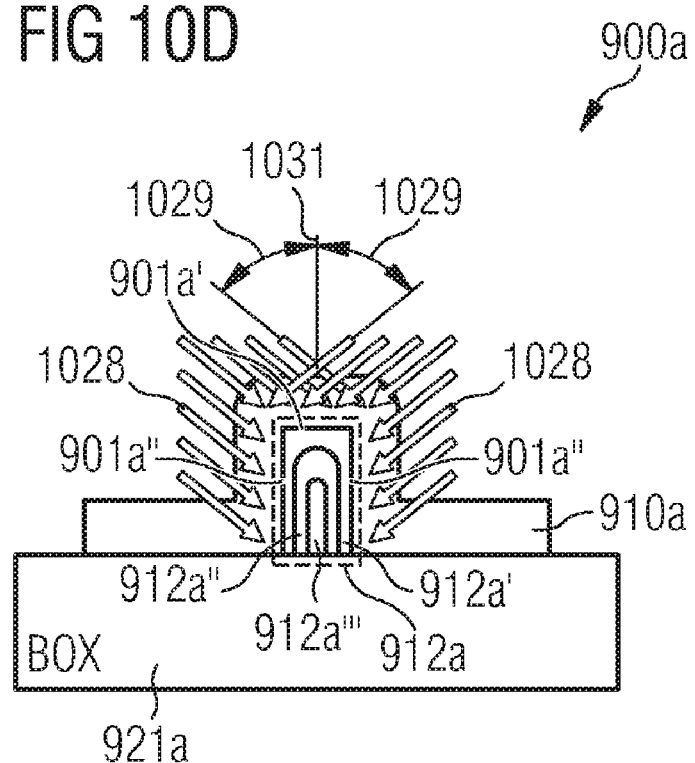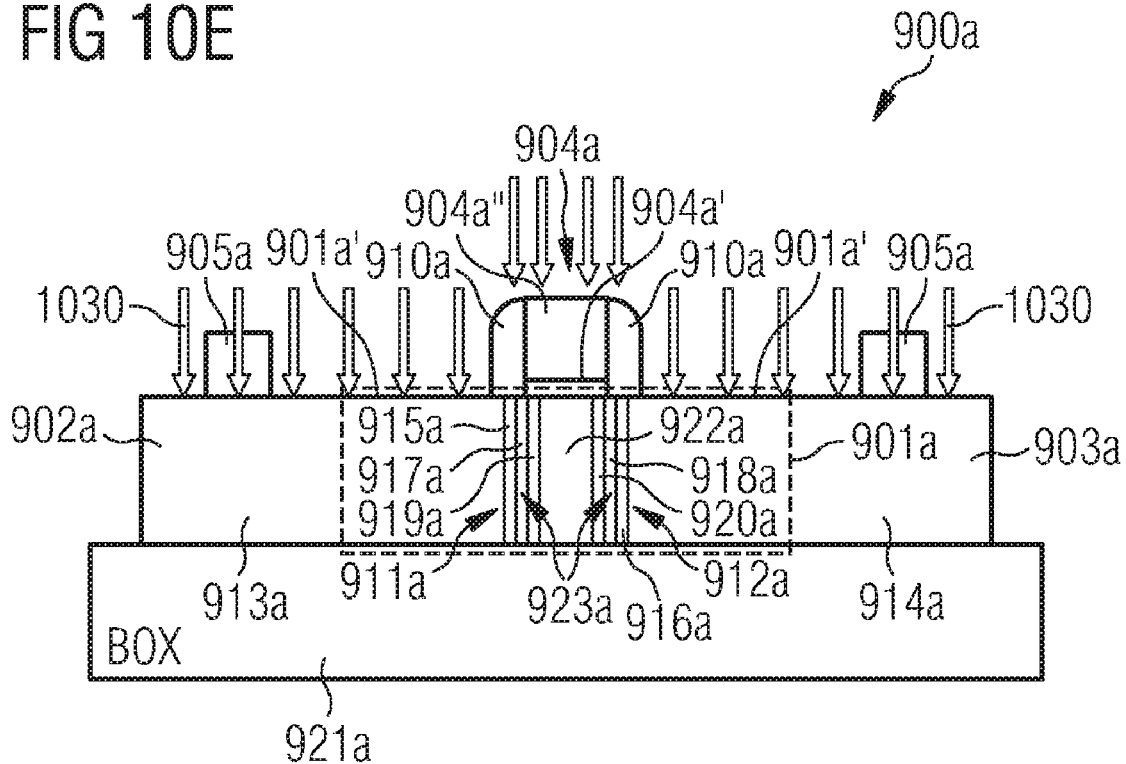

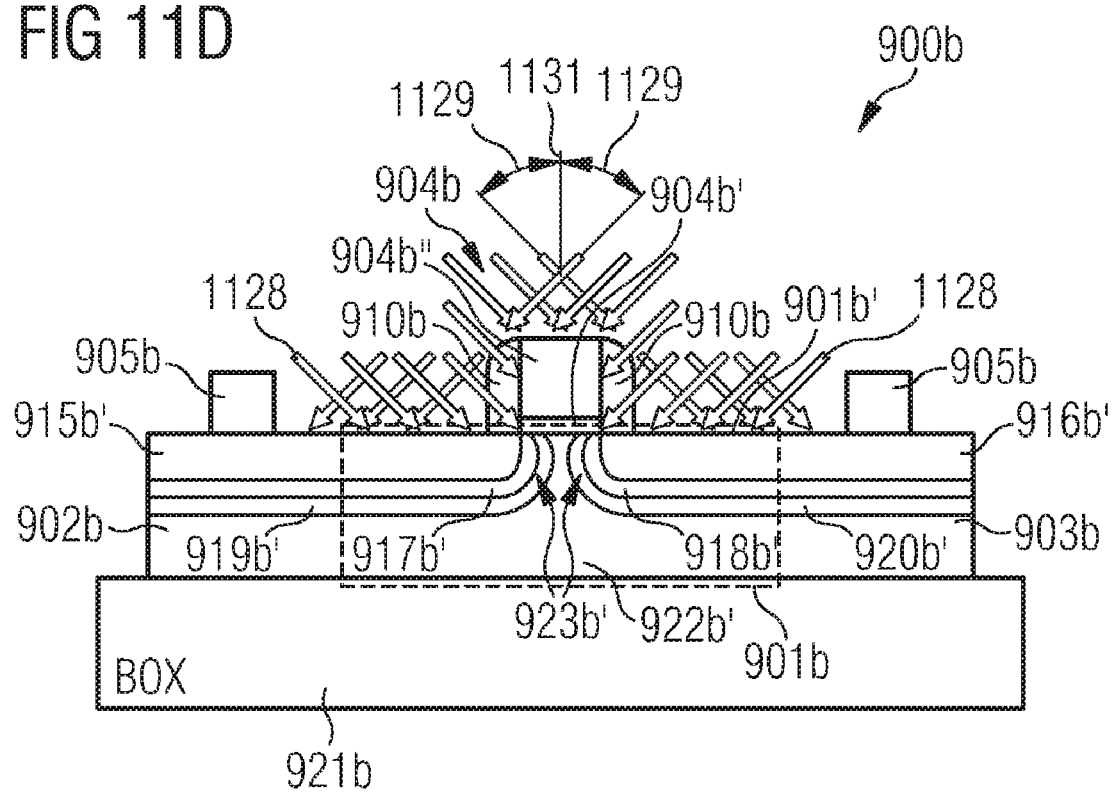
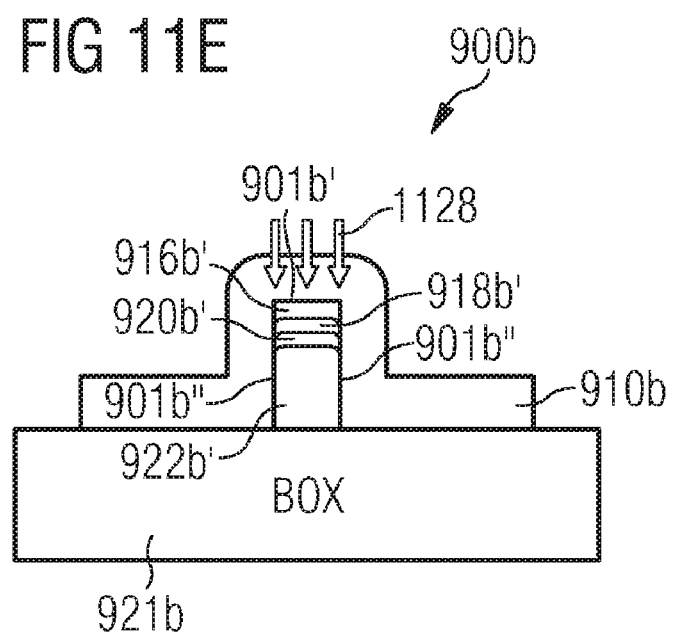

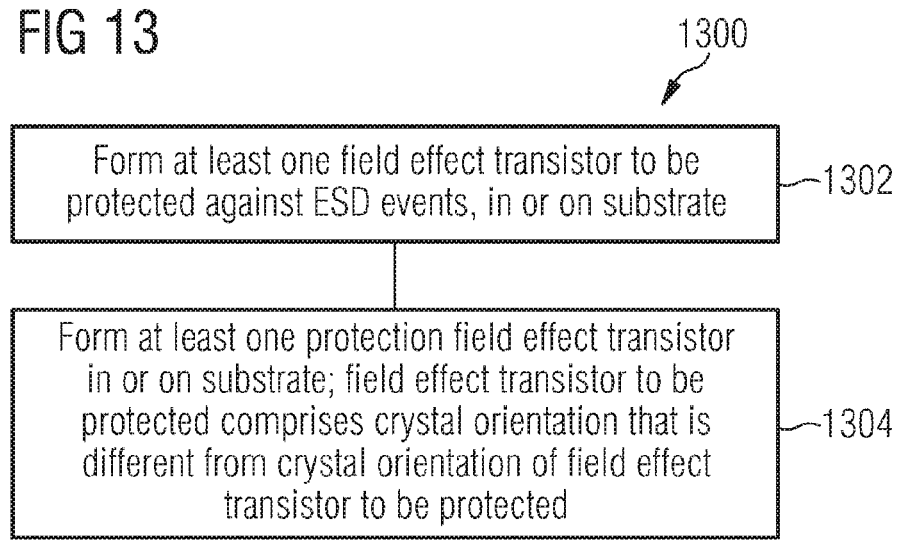
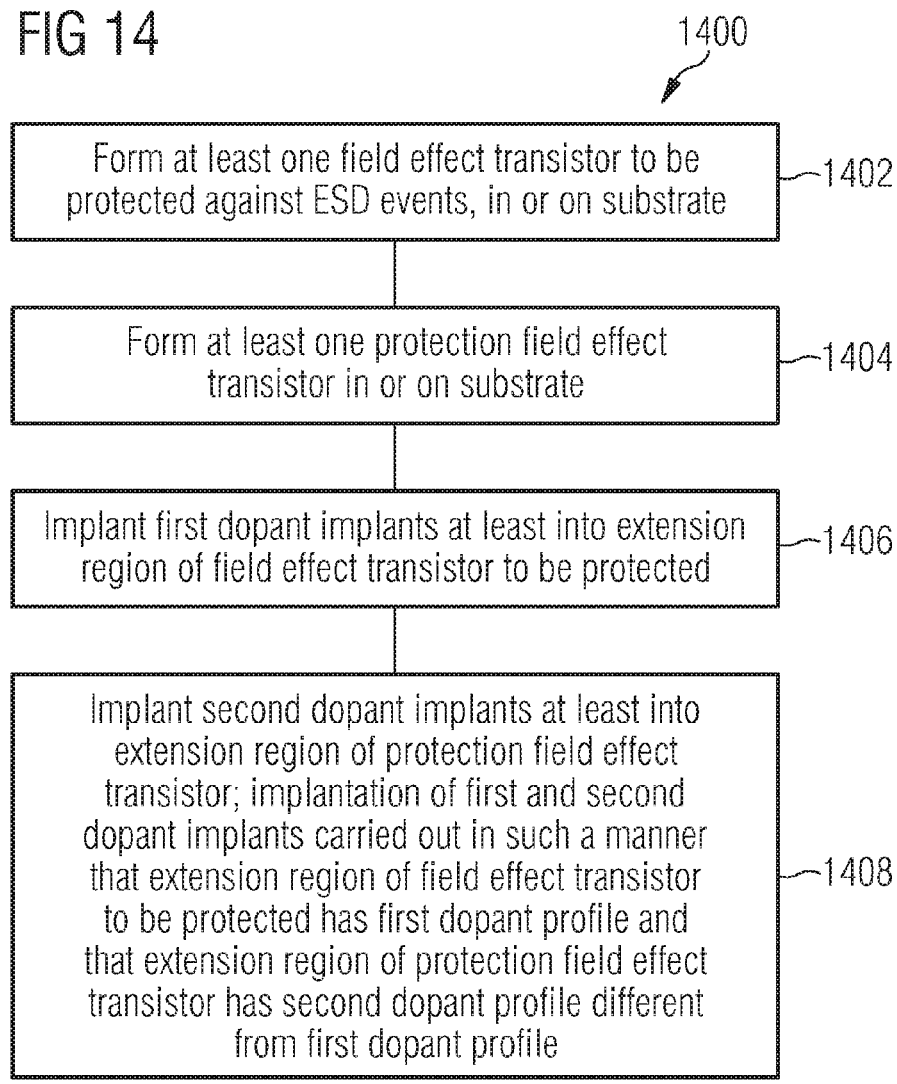

ELECTRONIC CIRCUIT AND METHOD OF MANUFACTURING AN ELECTRONIC CIRCUIT

TECHNICAL FIELD

Embodiments of the present invention relate generally to electronic circuits, and in particular, to the protection of circuit devices against electrostatic discharge (ESD) events.

SUMMARY OF THE INVENTION

An electronic circuit in accordance with one embodiment of the invention includes at least one field effect transistor that is to be protected against electrostatic discharge events, and at least one protection field effect transistor, wherein the protection field effect transistor has a crystal orientation that is different from a crystal orientation of the field effect transistor to be protected.

An electronic circuit in accordance with another embodiment of the invention includes at least one field effect transistor that is to be protected against electrostatic discharge events, and at least one protection field effect transistor, wherein an extension region of the field effect transistor to be protected has a first dopant profile, and wherein an extension region of the protection field effect transistor has a second dopant profile that is different from the first dopant profile.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5 shows an electronic circuit in accordance with another embodiment of the invention;

FIG. 9 shows an electronic circuit in accordance with another embodiment of the invention;

FIG. 13 shows a method of manufacturing an electronic circuit in accordance with another embodiment of the invention;

FIG. 14 shows a method of manufacturing an electronic circuit in accordance with another embodiment of the invention;

DETAILED DESCRIPTION OF ILLUSTRATIVE EMBODIMENTS

In advanced process technologies such as, for example, advanced silicon-on-insulator (SOI) technologies and fin field effect transistor (FinFET) or multi-gate field effect transistor (MuGFET) technologies, protection of circuit devices or elements (e.g., transistors) of integrated circuits against electrostatic discharge (ESD) events is a challenging task. In FinFET technologies, for example, ESD protection is difficult to achieve. In these technologies, ESD damage may occur at low ESD power levels. Therefore, maximum current and voltage levels that may safely be applied to devices in FinFET integrated circuits are very low.

In the context of this application, a FinFET is understood to mean a field effect transistor having a fin structure. A MuGFET is understood to mean a fin field effect transistor, in which a channel region is driven from at least two sides. A MuGFET driven from three sides is also referred to as a triple-gate field effect transistor or trigate field effect transistor. A fin structure or fin is understood to mean a ridge structure or a bridge structure which is formed or freely suspended on a substrate. The expressions fin structure or fin are used interchangeably hereinafter.

Figure 1:
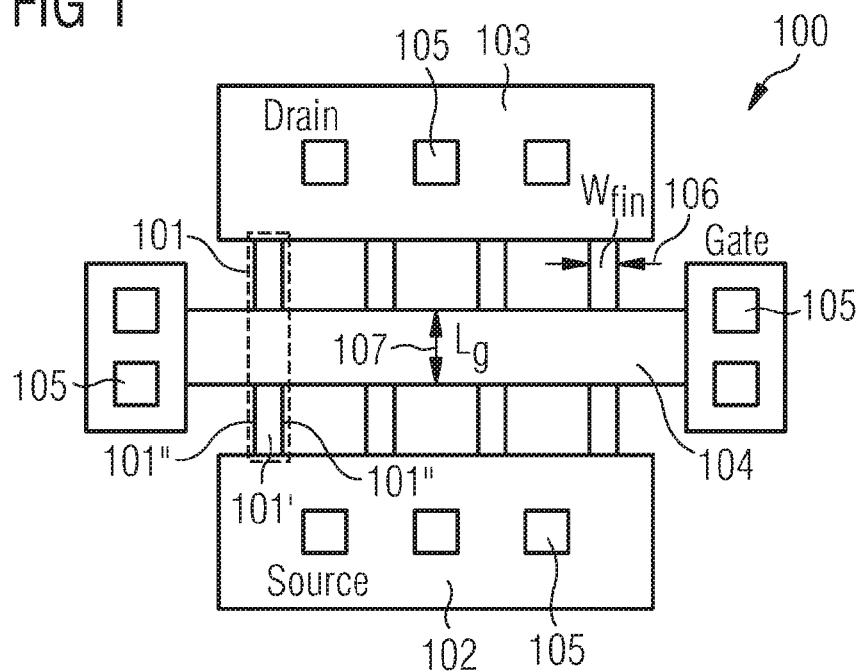
FIG. 1 shows a schematic layout view of a fin field or multi-gate field effect transistor device.

FIG. 1 shows a schematic layout view of a fin field or multi-gate field effect transistor 100. The field effect transistor 100 includes a plurality of fin structures 101, each of the fin structures 101 being connected at one end to a source region 102 and at another end to a drain region 103. Clearly, the field effect transistor 100 has a multi-fin structure including a plurality of fins 101 electrically connected in parallel between a source 102 and a drain 103 of the transistor 100. The fin structures 101 each have a width $W_{fin}$ denoted by the double arrow 106. The fin width $W_{fin}$ may, for example, be on the order of a few nanometers up to a few tens of a nanometer.

The field effect transistor 100 further includes a gate region 104 that is formed on the top surface 101' and on the sidewalls 101" of all the fin structures 101 above respective channel regions of the fins 101. In other words, the field effect transistor 100 includes a common gate 104 which extends over all the fins 101 of the multi-fin structure. The gate 104 may include a gate-insulating layer formed on the top surface 101' and on the sidewalls 101" of the fin structures 101, and a conductive gate layer formed on the gate-insulating layer (not shown).

The gate region 104 has a dimension $L_g$ (denoted by the double arrow 107) along the longitudinal direction or axis of the fins 101. In the context of this application, the longitudinal axis of a fin structure is understood to mean a line that is parallel to both the top surface and the sidewalls of the fin structure. $L_g$ clearly corresponds to the gate length and thus to the length of the channel region in each fin 101. The source region 102, the drain region 103 and the gate region 104 of the transistor 100 are each electrically contacted by means of respective electrical contacts 105 formed thereon. By means of applying a suitable electrical potential to the common gate 104, the conductivity in the channel regions of the fin structures 101 and thus the current flow through the transistor 100 may be controlled.

In an ESD surge, a very high current may be forced through the fins 101 of the transistor 100. Due to their very narrow width, the fins 101 may heat up strongly during an ESD event and may show local burnout as is illustrated in FIG. 2.

Figure 2:
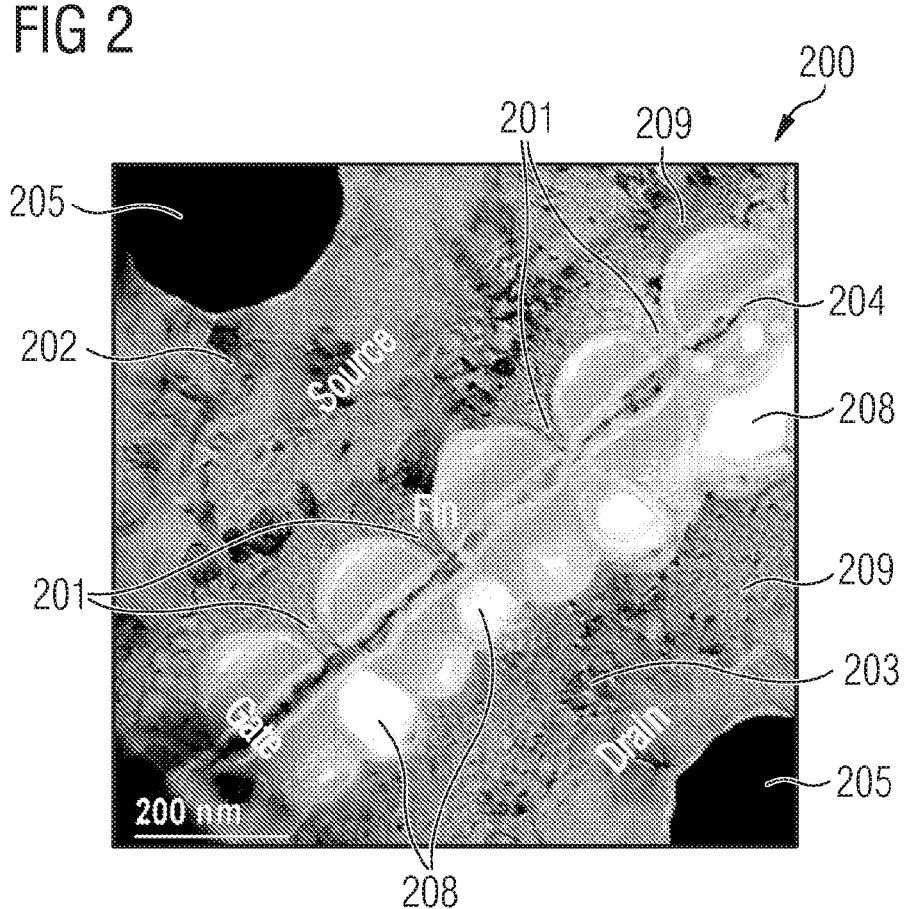
FIG. 2 shows a transmission electron microscopy micrograph of a multi-gate field effect transistor device.

FIG. 2 is a plan-view transmission electron microscopy (TEM) micrograph showing the burnout of fin structures at the drain side in a conventional silicon based MuGFET device 200. The MuGFET 200 includes a multi-fin structure having a plurality of fin structures 201 electrically connected in parallel to one another. The MuGFET 200 includes a common source region 202 and a common drain region 203 which are in each case electrically contacted by an electrical contact 205. The MuGFET 200 further includes a common gate 204 formed on the top surface and on the sidewalls of all the fins 201.

The white spots 208 in the TEM micrograph indicate the burnout of the fin structures 201 of the MuGFET 200. It is shown that the ESD damage (white spots 208) in each fin 201 is localized on the drain side 203 of the transistor 200, with re-crystallized silicon regions 209 stretching into the drain region 203 and also into the source region 202 of the MuGFET 200.

FIG. 2 illustrates the susceptibility of FinFET or MuGFET devices to ESD surges. In order to prevent damage or even destruction of these devices by an ESD event, ESD capable or robust devices (that is, devices that are capable of "surviving" an ESD surge) and/or ESD protection devices may be integrated into the respective circuits.

An ESD protection device may, for example, be understood as a device or structure that detects and carries an ESD current while keeping the voltage applied to the circuit devices below the failure level. The maximum voltage level is thus directly defined by internal device capability. With technology downscaling, the design window for ESD protection is narrowed down due to the reduction of the maximum voltage that can be applied to the devices in a respective circuit.

Figure 3:
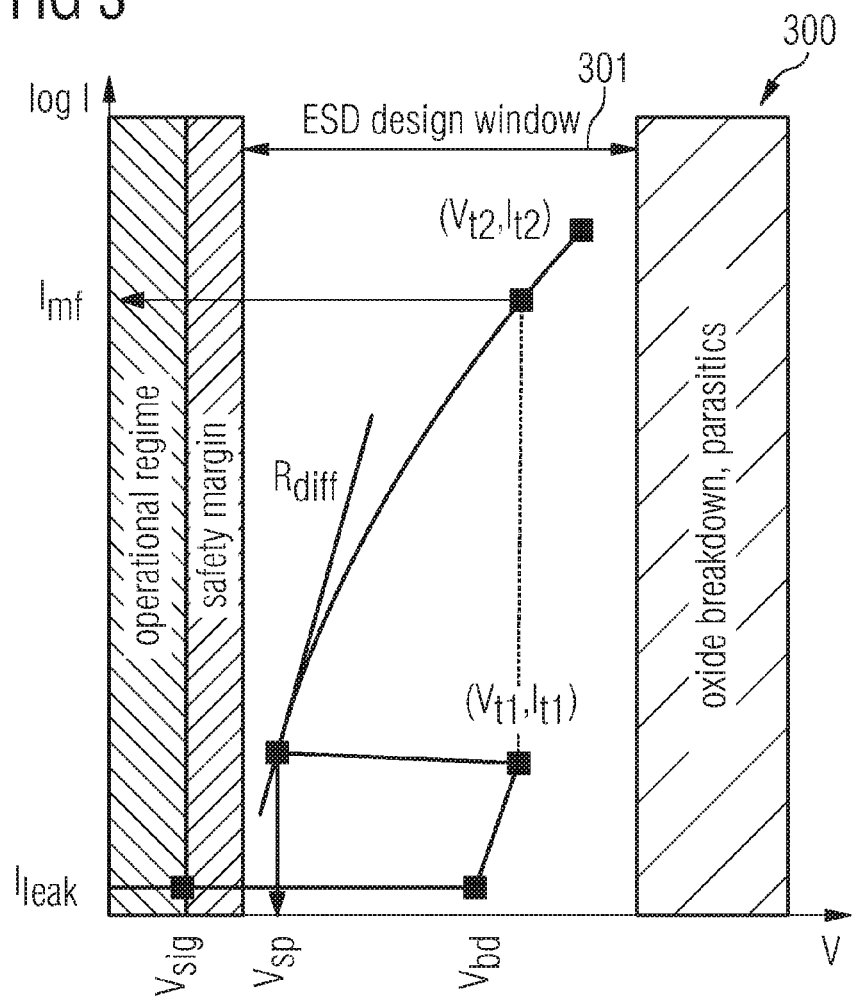
FIG. 3 shows a diagram illustrating an ESD design window.

FIG. 3 shows a diagram 300 that illustrates an ESD design window 301. It is shown that a maximum voltage across an ESD protection device of a circuit has to be kept below a maximum level defined by the circuit to be protected. Furthermore, an ESD protection device (also referred to as ESD clamp) has to trigger above the supply voltage and limit the voltage below destructive levels of a device to be protected (e.g., input/output (I/O) driver).

Figure 4B:
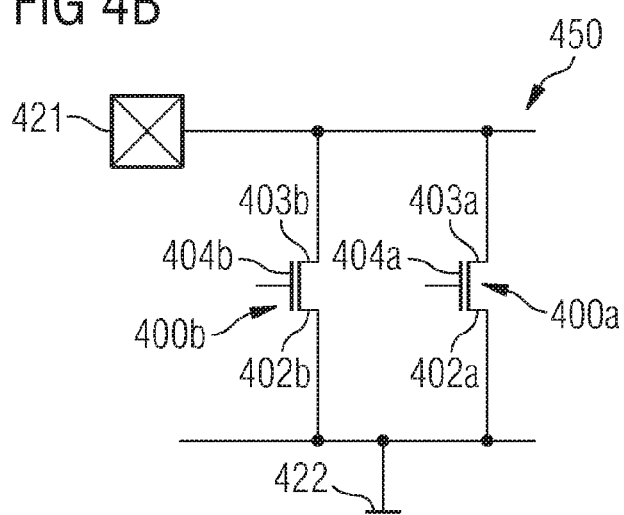
FIG. 4B shows an equivalent circuit diagram of the electronic circuit shown in FIG. 4A.
Figure 4A:
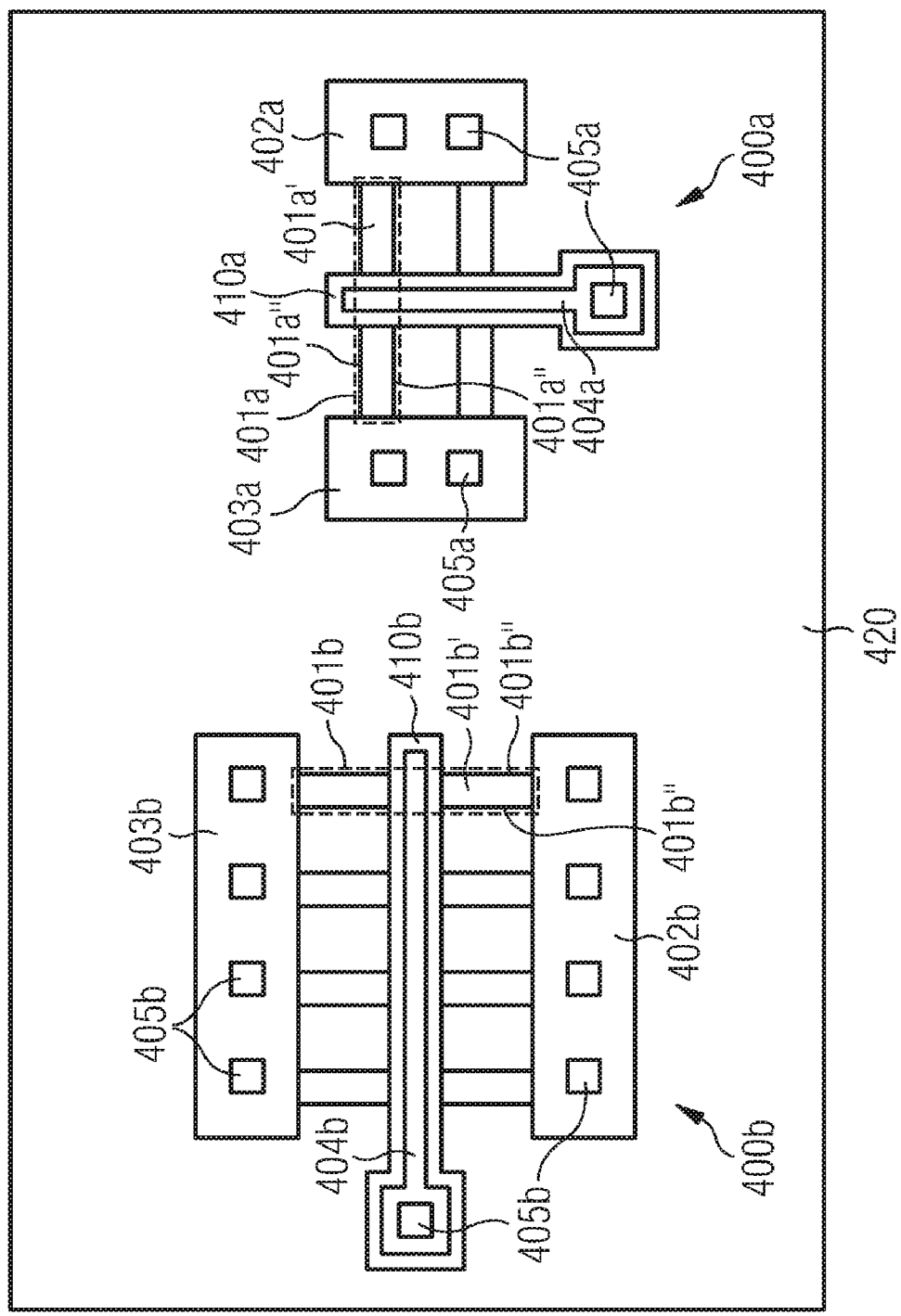
FIG. 4A shows an electronic circuit in accordance with an embodiment of the invention.

FIG. 4A shows an electronic circuit 400' in accordance with an embodiment of the invention. The electronic circuit 400' includes a field effect transistor 400a that is to be protected against electrostatic discharge (ESD) events. Furthermore, the electronic circuit 400' includes a protection field effect transistor 400b. The protection field effect transistor 400b has a crystal orientation that is different from a crystal orientation of the field effect transistor 400a to be protected. In accordance with other embodiments, additional field effect transistors that are to be protected and/or additional protection field effect transistors may be included in the electronic circuit 400' aside from the field effect transistor 400a and the protection field effect transistor 400b shown in FIG. 4A.

In accordance with some embodiments, the field effect transistor 400a may be configured as a functional field effect transistor, for example, as a logic field effect transistor or as an input/output (I/O) driver field effect transistor in accordance with one embodiment.

In accordance with the embodiment shown in FIG. 4A, the protection field effect transistor 400b is coupled to the field effect transistor 400a (not shown in FIG. 4A, see FIG. 4B) in order to provide ESD protection thereof.

The field effect transistor 400a is configured as a fin field effect transistor, including a plurality of fin structures 401a. In FIG. 4A, two fin structures are shown as an example, although the field effect transistor 400a may include a different number of fin structures 401a in accordance with other embodiments. The field effect transistor 400a further includes a first source/drain region 402a and a second source/drain region 403a, the fin structures 401a being connected with one end portion to the first source/drain region 402a and with another end portion to the second source/drain region 403a.

Clearly, the field effect transistor 400a has a multi-fin structure including a plurality of fins 401a electrically connected in parallel between the first source/drain region 402a and the second source/drain region 403a of the field effect transistor 400a.

The field effect transistor 400a further includes a gate region 404a that is formed on the top surface 401a' and on the sidewalls 401a" of all the fin structures 401a above respective channel regions of the fins 401a. In other words, the field effect transistor 400a includes a common gate 404a which extends over all the fin structures 401a of the field effect transistor 400a. The gate 404a may include a gate insulating layer formed on the top surface 401a' and on the sidewalls 401a" of the fin structures 401a, and a conductive gate layer formed on the gate insulating layer (not shown in FIG. 4A).

The first source/drain region 402a, the second source/drain region 403a, and the gate region 404a of the field effect transistor 400a are each electrically contacted by means of respective electrical contacts 405a formed thereon. The field effect transistor 400a further includes a gate spacer region 410a formed adjacent to the gate region 404a.

The protection field effect transistor 400b is also configured as a fin field effect transistor in accordance with the embodiment shown in FIG. 4A, and has a similar structure as the field effect transistor 400a to be protected. The protection field effect transistor 400b has a multi-fin structure including a plurality of fin structures or fins 401b (in FIG. 4A, four fin structures 401b are shown as an example, although the protection field effect transistor 400b may include a different number of fin structures 401b in accordance with other embodiments).

The protection field effect transistor 400b includes a first source/drain region 402b and a second source/drain region 403b connected to the fin structures 401b in a similar manner as has been described above in connection with the field effect transistor 400a. The protection field effect transistor 400b further includes a gate region 404b formed on the upper surface 401b' and on the sidewalls 401b" of each fin structure 401b of the protection field effect transistor 400b in a similar manner as the gate region 404a of the field effect transistor 400a described herein above. Furthermore the protection field effect transistor 400b includes a gate spacer region 410b formed adjacent to the gate region 404b.

In accordance with the embodiment shown in FIG. 4A, the electronic circuit 400' includes a substrate, wherein the field effect transistor 400a to be protected and the protection field effect transistor 400b are formed in or on a common crystalline region 420 of the substrate, that is in or on a region having a given crystal orientation. In alternative embodiments, the field effect transistors 400a and 400b may be formed in or on separate crystalline regions of the substrate, the crystalline regions having the same crystal orientation.

In accordance with the embodiment shown in FIG. 4A, the field effect transistors 400a and 400b of the electronic circuit 400' are orientated at different angles in or on the common crystalline region 420. FIG. 4A shows that the fin structures

401a of the field effect transistor 400a are orientated along a west-to-east orientation, whereas the fin structures 401b of the protection field effect transistor 400b are orientated along a north-to-south direction with reference to the orientations N (north), S (south), W (west), and E (east) indicated by the compass rose 430 in FIG. 4A. In this connection it is noted that the compass rose 430 shown in FIG. 4A merely serves as a reference system for determining relative device orientations on the substrate of the electronic circuit 400', and does not refer to absolute or even actual geographical orientations. Furthermore, the specific orientations of the field effect transistor 400a and the protection field effect transistor 400b with respect to the reference system 430 are only exemplary. For example, the orientations may also be exchanged in accordance with other embodiments.

In accordance with some embodiments, the substrate may be configured as a silicon-on-insulator (SOI) substrate (e.g., as an SOI wafer) including a thin silicon layer with a predetermined crystal surface orientation (for example, a (100) surface orientation or a (110) surface orientation in accordance with some embodiments) and formed on an electrically insulating layer, and the crystalline region 420 may correspond to a portion of the thin silicon layer of the SOI substrate. In other words, the upper surface or main processing surface of the crystalline region 420 may be a (100) surface or a (110) surface in accordance with some embodiments. In case of an SOI substrate, the fin structures 401a, 401b and/or the source/drain regions 402a, 403a, 402b, and 403b of the field effect transistors 400a, 400b may be formed in the thin silicon layer of the SOI substrate.

In accordance with the embodiment shown in FIG. 4A, the fin structures 401b of the protection field effect transistor 400b and the fin structures 401a of the field effect transistor 400a to be protected are orientated in such a manner that the fin structures 401b of the protection field effect transistor 400b are rotated by a rotation angle of 90° (around a rotation axis that is perpendicular to the main processing surface of the substrate) with respect to the fin structures 401a of the field effect transistor 400a to be protected. In other words, in the electronic circuit 400' shown in FIG. 4A, the fin structures 401b of the protection field effect transistor 400b are orientated perpendicular to the fin structures 401a of the field effect transistor 400a to be protected. Thus, the protection field effect transistor 400b, and in particular its fin structures 401b, have a crystal orientation that is different from the crystal orientation of the non-rotated fin structures 401a or field effect transistor 400a.

Clearly, the different crystal orientations in the fin structures 401b, 401a of the protection field effect transistor 400b and the field effect transistor 400a correspond to a possible crystallographic anisotropy of the crystal structure of the underlying crystalline region 420. That is, an electrical current that flows through a fin structure 401b of the protection field effect transistor 400b, which is aligned in the north-to-south direction, encounters a different arrangement of the crystal atoms than an electrical current that flows through a fin structure 401a of the field effect transistor 400a, which is aligned in the west-to-east direction.

FIG. 4B shows an equivalent circuit diagram 450 of the electronic circuit 400' shown in FIG. 4A. It is shown, that in accordance with this embodiment, the field effect transistor 400a to be protected and the protection field effect transistor 400b are electrically connected in parallel between a pad 421 (for example, a contact pad or an external pin) and an electrical reference potential node 422. The field effect transistors 400a, 400b, are coupled with their first source/drain regions 402a, 402b to the node 422, and are coupled with their second source/drain regions 403a, 403b to the pad 421. In the circuit diagram 450 shown in FIG. 4B, the coupling of the first source/drain regions 402a, 402b to the node 422 and the coupling of the second source/drain regions 403a, 403b to the pad 421 are each shown as low-ohmic coupling (e.g., low-ohmic interconnects). It is understood, though, that in accordance with some embodiments, one or more resistive elements may be coupled between at least one of the field effect transistors 400a, 400b and the pad 421 and/or the node 422.

During an ESD event, a high potential difference may build up between the pad 421 and the reference potential node 422, thus forcing a high ESD current through the electronic circuit 450. As the protection field effect transistor 400b (that is, in particular the fin structures 401b of the protection field effect transistor 400b) has a different crystal orientation than the field effect transistor 400a to be protected (that is, in particular, different than the fin structures 401a of the field effect transistor 400a), the protection field effect transistor 400b may have a lower ESD triggering voltage such that the protection field effect transistor 400b may trigger first during the ESD event. Therefore, the ESD current may be carried mainly by the protection field effect transistor 400b and may thus be kept away from the field effect transistor 400a to be protected, such that a damage of the field effect transistor 400a by the high ESD current may be avoided.

FIG. 5 shows an electronic circuit 500' in accordance with another embodiment of the invention. The electronic circuit 500' is different from the electronic circuit 400' shown in FIG. 4A in that the field effect transistor 400a to be protected (for example, the functional field effect transistor in accordance with one embodiment) is rotated by a rotation angle of 45° instead of 90°. In other words, the field effect transistor 400a (that is, in particular the fin structures 401a of the field effect transistor 400a) in the electronic circuit 500' is aligned along the northwest-to-southeast direction.

It is noted that, in accordance with other embodiments, the field effect transistor 400a and the protection field effect transistor 400b may be orientated at different angles with respect to one another. In other words, the field effect transistor 400a (e.g., the functional field effect transistor) may be rotated by a rotation angle other than the ones shown in FIG. 4A and FIG. 5 (that is, other than 90° or 45°) with respect to the protection field effect transistor 400b.

In accordance with some embodiments, by rotating the fin structures of a FinFET device by a rotation angle with respect to the standard orientation of the fin structures on a crystalline substrate (for example, on a crystalline wafer) the trigger voltage of the FinFET devices may be pushed higher. In other words, a rotated device may have a higher ESD trigger voltage than a non-rotated device with the fin structures orientated along the standard direction.

In accordance with some embodiments, the rotated devices (having the higher ESD trigger voltage) may be used as functional devices in the electronic circuit, while the non-rotated devices having the lower ESD trigger voltage (and thus triggering first in an ESD event) may be used as ESD protection devices for protecting the functional devices against electrostatic discharge events.

Figure 6:
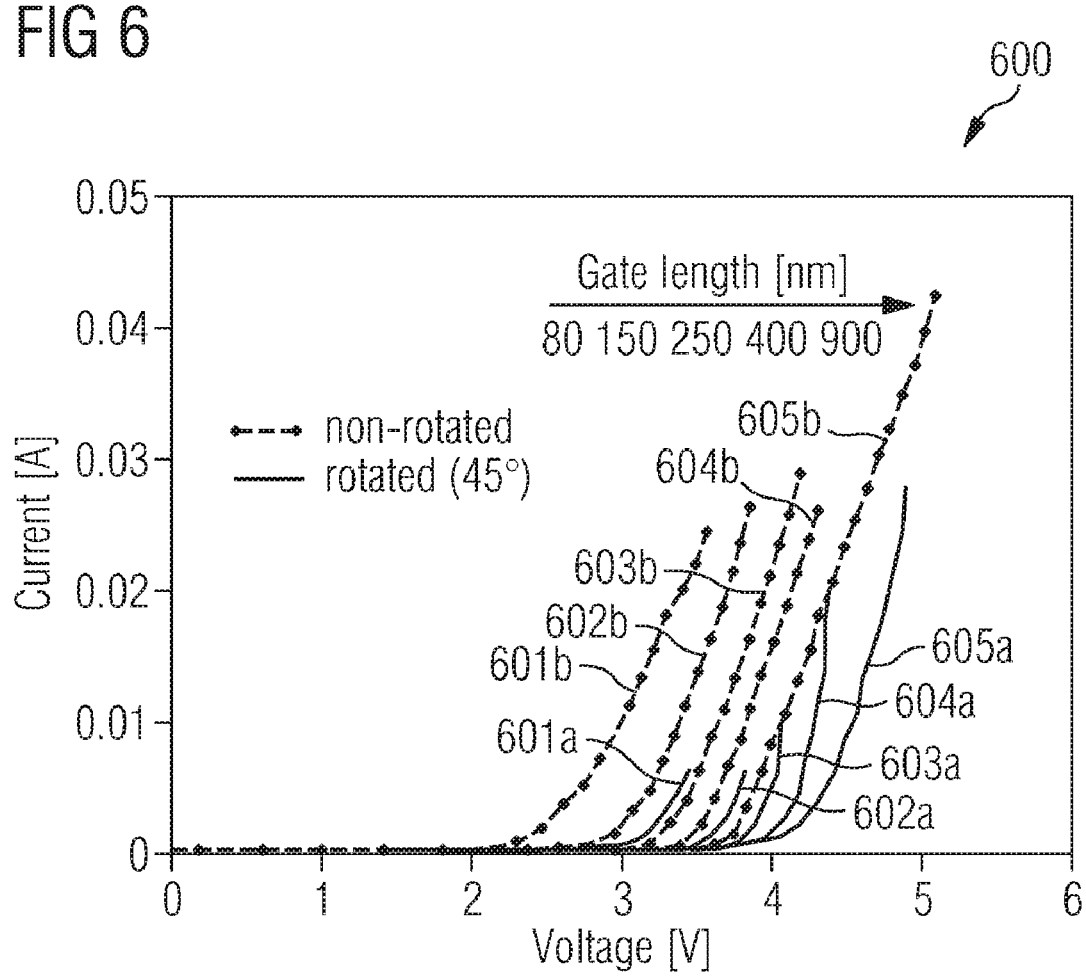
FIG. 6 shows current-voltage characteristics of various field effect transistor devices.

FIG. 6 shows a diagram 600 that illustrates current-voltage characteristics of rotated and non-rotated field effect transistor devices for various values of the gate length. It is noted that the gate lengths indicated in the diagram 600 refer to drawn gate lengths in the device layouts. The actual, i.e., physical, gate length of a device after processing may differ from the drawn gate length, and may, for example, be shorter than the drawn gate length. The curves in the diagram 600 show the results of experimental measurements of the drain-to-source current versus the applied drain-to-source voltage (with the source and the gate being grounded) for NMOS FinFET devices having different crystal orientations. In particular, the curves 601*b*, 602*b*, 603*b*, 604*b*, and 605*b* show measurement results for non-rotated or standard devices having a <100> crystal orientation, while the curves 601*a*, 602*a*, 603*a*, 604*a*, and 605*a* show measurement results for devices which have been rotated by a rotation angle of 45° with respect to the standard orientation devices, this rotation corresponding to a <110> crystal orientation of the rotated devices.

Each of the curves 601*b*, 602*b*, 603*b*, 604*b*, and 605*b* corresponds to a measurement for a device having a given value of the gate length. In particular, the curve 601*b* shows the measurement results for a non-rotated device having a gate length of 80 nm, the curve 602*b* shows the measurement results for a non-rotated device having a gate length of 150 nm, the curve 603*b* shows the measurement results for a non-rotated device having a gate length of 250 nm, the curve 604*b* shows the measurement results for a non-rotated device having a gate length of 400 nm, and the curve 605*b* shows the measurement results for a non-rotated device having a gate length of 900 nm.

Similarly, each of the curves 601*a*, 602*a*, 603*a*, 604*a*, and 605*a* corresponds to a measurement for a rotated device having a given value of the gate length. In particular, the curve 601*a* shows the measurement results for a rotated device having a gate length of 80 nm, the curve 602*a* shows the measurement results for a rotated device having a gate length of 150 nm, the curve 603*a* shows the measurement results for a rotated device having a gate length of 250 nm, the curve 604*a* shows the measurement results for a rotated device having a gate length of 400 nm, and the curve 605*a* shows the measurement results for a rotated device having a gate length of 900 nm.

From the diagram 600, the trigger voltage levels for the respective field effect transistor devices can be inferred. The triggering voltage level of a given device may, for example, be understood as the voltage value in the diagram 600 where the current through this device rises significantly, in other words that voltage value where the respective one of the curves 601*a* to 605*b* starts to rise significantly.

For example, a trigger voltage of about 2.2 V may be inferred from the diagram 600 for a non-rotated device having a gate length of 80 nm (curve 601*b*), and a trigger voltage of about 4 V may be inferred for a rotated device having a gate length of 900 nm (curve 605*a*).

From the diagram 600, an increased triggering voltage level is observed for the rotated devices as compared to the non-rotated (that is standard orientation) devices for a given value of the gate length. For example, a triggering voltage of about 2.2 V is observed for a non-rotated device having a gate length of 80 nm (curve 601*b*), while a triggering voltage of about 3.1 V is observed for a rotated device having the same value (80 nm) of the gate length (curve 601*a*).

Furthermore, comparing the endpoints of the curves 601*a*, 602*a*, 603*a*, 604*a*, and 605*a* (corresponding to the rotated devices) with the corresponding endpoints of the curves 601*b*, 602*b*, 603*b*, 604*b*, and 605*b* (corresponding to the non-rotated devices), it can be seen that, for a given value of the gate length, the non-rotated device is able to carry a higher current than the rotated device. That is, in addition to a lower ESD trigger voltage, the non-rotated devices have a higher ESD hardness than the rotated devices. Therefore, the non-rotated devices are suitable as ESD protection devices, while the rotated devices may be used as functional devices having a higher trigger voltage.

By means of using non-rotated devices as protection devices, the ESD current may be kept away from (rotated) functional devices. Furthermore, by using rotated functional devices, the ESD design window is increased since the trigger voltage is pushed to higher levels. An additional effect of the rotation of the functional devices may be the capability to carry a higher MOS drive current.

Although the embodiments described herein above in connection with FIG. 4A to FIG. 6 were mainly described in connection with field effect transistors based on FinFET or MuGFET technologies, it is to be understood that, in accordance with other embodiments, the field effect transistors in an electronic circuit similar to the ones described herein above may also be configured as planar devices, for example, as planar SOI devices in accordance with some embodiments, e.g., as planar partially depleted (PD) SOI field effect transistor devices in accordance with one embodiment.

For example, an electronic circuit in accordance with one embodiment may include at least one field effect transistor that is to be protected against electrostatic discharge events, the field effect transistor being configured as a planar SOI field effect transistor, and at least one protection field effect transistor also configured as a planar SOI field effect transistor, wherein the protection field effect transistor has a crystal orientation that is different from a crystal orientation of the field effect transistor to be protected.

In accordance with some embodiments, the planar field effect transistor to be protected and the planar protection field effect transistor may both be formed in and/or on the same crystalline region of an SOI substrate, wherein the field effect transistor to be protected and the protection field effect transistor are rotated by a rotation angle with respect to one another such that the protection field effect transistor has a different crystal orientation than the field effect transistor to be protected.

Clearly, in accordance with some embodiments, a field effect transistor to be protected and a protection field effect transistor, both configured as planar devices (for example, as planar SOI devices in accordance with some embodiments, e.g., as partially depleted SOI devices in accordance with one embodiment), may be formed in and/or on the same crystalline region (for example, in and/or on a thin silicon layer on top of a buried oxide (BOX) layer of an SOI substrate), with the two transistors orientated at different angles such that the two transistors have different crystal orientations. Due to the different crystal orientations of the rotated and non-rotated planar devices, similar effects may be observed as described herein above in connection with the FinFET based devices.

Figure 7:
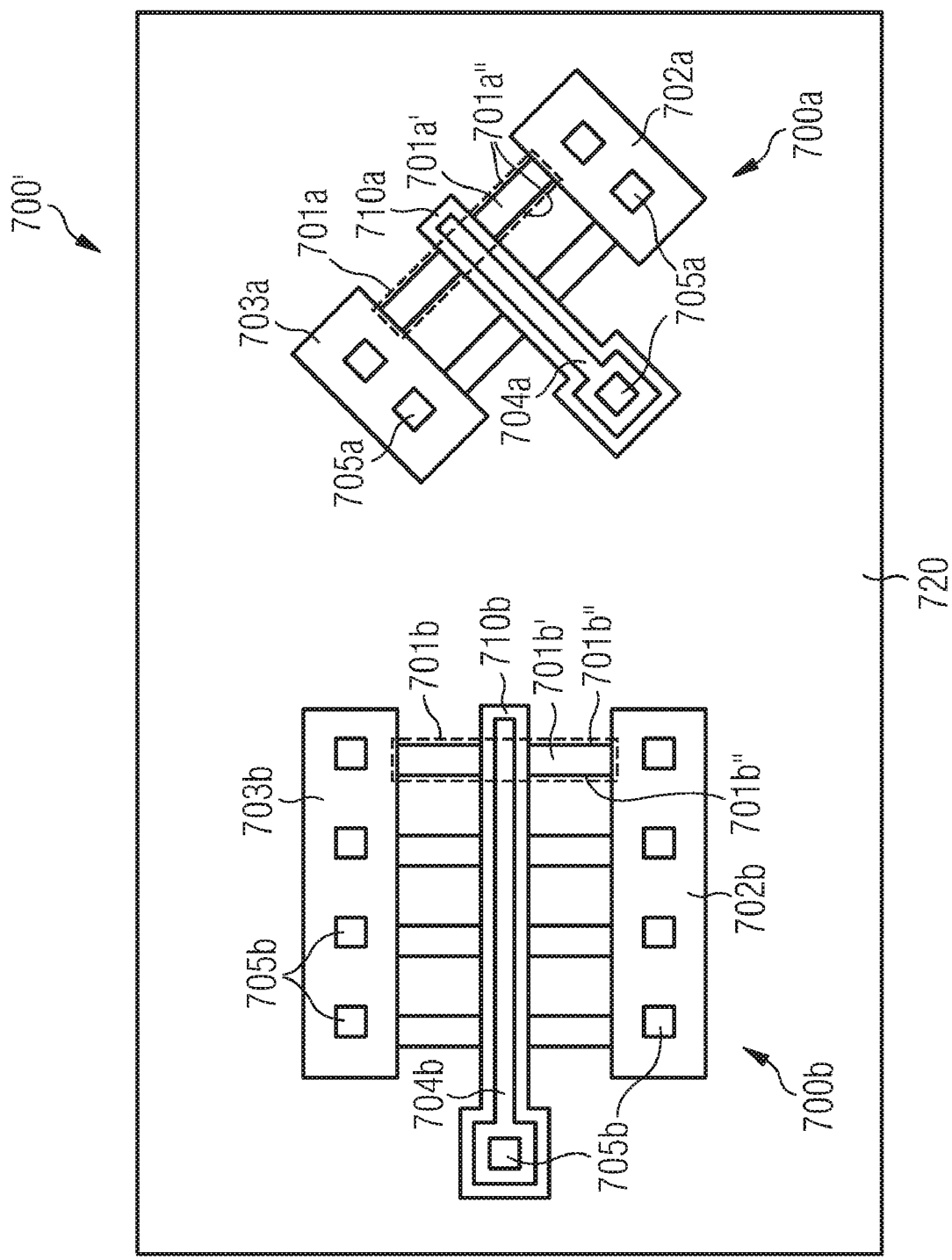
FIG. 7 shows an electronic circuit in accordance with another embodiment of the invention.

FIG. 7 shows an electronic circuit 700' in accordance with another embodiment of the invention. The electronic circuit 700' includes a functional field effect transistor 700*a* (more than one functional field effect transistor may be included in the electronic circuit 700' in accordance with other embodiments), and an ESD robust field effect transistor 700*b* (more than one ESD robust field effect transistor may be included in the electronic circuit 700' in accordance with other embodiments), wherein the ESD robust field effect transistor 700*b* has a different crystal orientation than the functional field effect transistor 700*a*.

The functional field effect transistor 700*a* is configured as a fin field effect transistor having a multi-fin structure including a plurality of fin structures (fins) 701*a* (two fin structures 701*a* are shown in FIG. 7, however the functional field effect transistor 700*a* may include a different number of fin structures 701*a*, in accordance with other embodiments). The fin structures 701*a* are electrically connected in parallel between a first source/drain region 702*a* and a second source/drain region 703a of the functional field effect transistor 700a. A gate region 704a is formed on the top surface 701a' and on the sidewalls 701a" of each of the fin structures 701a, and a gate spacer region 710a is formed adjacent to the gate region 704a. The first source/drain region 702a, the second source/drain region 703a, and the gate region 704a are electrically contacted by means of respective electrical contacts 705a formed thereon.

In accordance with one embodiment, the functional field effect transistor 700a may be configured as a logic field effect transistor, for example, as a core logic field effect transistor (that is, as a logic field effect transistor located in the core of an integrated circuit, e.g., of a chip).

The ESD robust field effect transistor 700b is also configured as a fin field effect transistor having a multi-fin structure including a plurality of fin structures (fins) 701b (four fin structures 701b are shown in FIG. 7, however the ESD robust field effect transistor 700b may include a different number of fin structures 701b in accordance with other embodiments). The fin structures 701b are electrically connected in parallel between a first source/drain region 702b and a second source/drain region 703b of the ESD robust field effect transistor 700b. A gate region 704b is formed on the top surface 701b' and on the sidewalls 701b" of each fin structure 701b, and a gate spacer region 710b is formed adjacent to the gate region 704b. The first source/drain region 702b, the second source/drain region 703b, and the gate region 704b are electrically contacted by means of respective electrical contacts 705b formed thereon.

In accordance with one embodiment, the ESD robust field effect transistor 700b may be configured as an output driver field effect transistor.

The functional field effect transistor 700a and the ESD robust field effect transistor 700b are formed in or on a common crystalline region 720 of a substrate of the electronic circuit 700'. In alternative embodiments, the field effect transistors 700a and 700b may be formed in or on separate crystalline regions of the substrate, the crystalline regions having the same crystal orientation. The substrate may be configured as an SOI substrate, and the crystalline region 720 may correspond to a portion of a thin silicon layer of the SOI substrate formed on an insulating layer, as described herein above in connection with FIG. 4A.

The field effect transistors 700a, 700b are orientated at different angles in or on the common crystalline region 720. In other words, the functional field effect transistor 700a and the ESD robust field effect transistor 700b are orientated in such a manner that the fin structures 701a of the functional field effect transistor 700a are rotated by a predetermined rotation angle with respect to the fin structures 701b of the ESD robust field effect transistor 700b. In accordance with the embodiment shown in FIG. 7, the functional field effect transistor 700a is rotated by a rotation angle of 45° with respect to the ESD robust field effect transistor 700b. In accordance with alternative embodiments, the functional field effect transistor 700a may be rotated by a different rotation angle with respect to the ESD robust field effect transistor 700b.

By means of the rotation, the ESD robust field effect transistor 700b (that is, in particular the fin structures 701b) has a different crystal orientation than the functional field effect transistor 700a (that is, in particular, different than the fin structures 701a) and may thus have a lower ESD trigger voltage than the functional field effect transistor 700a.

In accordance with one embodiment, the ESD robust field effect transistor 700b may be configured as an ESD capable output driver field effect transistor having a lower ESD trigger voltage than the functional field effect transistor 700a and being capable of carrying a higher ESD current. In other words, the ESD robust field effect transistor 700b may be configured as a self-protective output driver, that is as an output driver with inherent ESD capability or protection. Therefore, in accordance with some embodiments, the ESD robust field effect transistor 700b does not require an additional ESD protection device.

In accordance with alternative embodiments, one or both of the transistors 700a, 700b may be configured as planar devices, for example, as planar SOI devices in accordance with some embodiments, e.g., as partially depleted SOI field effect transistor devices in accordance with one embodiment.

It is noted, that the functional field effect transistor 700a and the ESD robust field effect transistor 700b (for example, the output driver transistor) may be formed in different areas of the substrate (e.g., areas on a chip that are not located close to one another) and do not have to be electrically connected to one another.

Figure 8:
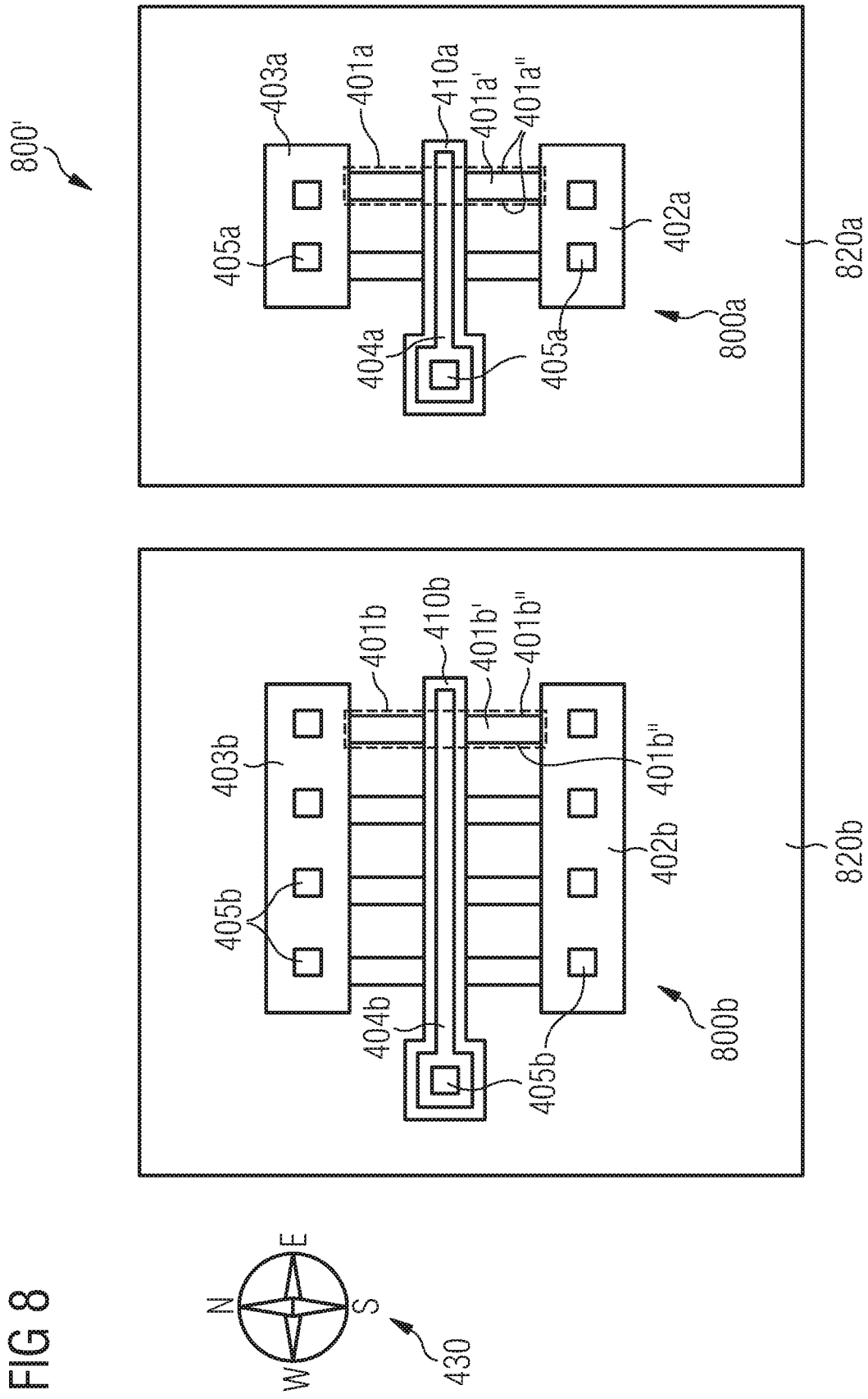
FIG. 8 shows an electronic circuit in accordance with another embodiment of the invention.

FIG. 8 shows an electronic circuit 800' in accordance with another embodiment of the invention. The electronic circuit 800' includes a field effect transistor 800a that is to be protected against electrostatic discharge events, and a protection field effect transistor 800b. In accordance with the embodiment shown in FIG. 8, both the field effect transistor 800a to be protected and the protection field effect transistor 800b are configured as fin field effect transistors in a similar manner as described herein above in connection with, for example, the transistors of the electronic circuit 400' shown in FIG. 4A.

In accordance with alternative embodiments, the field effect transistor 800a and/or the protection field effect transistor 800b may be configured as a planar device, for example as a planar SOI device, e.g., as a partially depleted SOI field effect transistor.

The electronic circuit 800' includes a substrate having a first crystalline region 820a with a first crystal orientation, and a second crystalline region 820b with a second crystal orientation different from the first crystal orientation. The field effect transistor 800a is formed in or on the first crystalline region 820a whereas the protection field effect transistor 800b is formed in or on the second crystalline region 820b.

In accordance with one embodiment, the substrate may be configured as an SOI substrate and the first crystalline region 820a and the second crystalline region 820b may correspond to two regions of the substrate having different crystal orientations.

For example, the first crystalline region 820a may correspond to a first portion of a top silicon layer of an SOI substrate having a first crystal orientation, and the second crystalline region 820b may correspond to a crystalline region with a second crystal orientation, which has been obtained by removing a second portion of the top silicon layer of the SOI substrate (thereby forming a trench), and form the second crystalline region 820b in the trench (for example, by means of epitaxial regrowth on a substrate silicon layer having a different crystalline orientation and by that determining the crystal orientation of the re-grown epi silicon in the trench).

The first crystalline region 820a of the substrate has a first crystal orientation (in accordance with one embodiment, for example, a <110> crystal orientation), and the second crystalline region 820b has a second crystal orientation that is different from the first crystal orientation (for example, a <100> crystal orientation in accordance with one embodiment) such that the field effect transistor 800a to be protected (that is, in particular the fin structures 401a thereof), also has a different crystal orientation than the protection field effect transistor 800*b* (that is, in particular different than the fin structures 401*b* thereof).

Due to the different crystal orientations of the field effect transistors 800*a*, 800*b*, a difference in the triggering voltage level may occur similarly as described herein above in connection with previously discussed embodiments. For example, the field effect transistor 800*a* to be protected may have a higher ESD trigger voltage than the protection field effect transistor 800*b*. The field effect transistor 800*a* may thus be used as a functional device (for example, as a logic device or as an input/output driver), and the protection field effect transistor 800*b* may be used as a protection device having a lower ESD trigger voltage than the functional device 800*a* and further having, for example, a higher ESD hardness than the functional device 800*a*, thus being capable of protecting the functional device 800*a* against electrostatic discharge events.

It is noted, that although the field effect transistors 800*a*, 800*b* of the electronic circuit 800' have been shown to be orientated in the same orientation, in accordance with alternative embodiments the field effect transistor 800*a* may also be rotated by a predetermined rotation angle with respect to the protection field effect transistor 800*b*, or vice versa, as described herein above in connection with previously discussed embodiments of the invention.

FIG. 9 shows an electronic circuit 900' in accordance with another embodiment of the invention. The electronic circuit 900' includes a field effect transistor 900*a* that is to be protected against electrostatic discharge events, and a protection field effect transistor 900*b*. An extension region of the protection field effect transistor 900*b* has a dopant profile that is different from a dopant profile of an extension region of the field effect transistor 900*a* to be protected, as will be described herein below.

In accordance with the embodiment shown in FIG. 9, both the field effect transistor 900*a* to be protected and the protection field effect transistor 900*b* are configured as fin field effect transistors, wherein cross-sectional views of the field effect transistors 900*a*, 900*b* along the longitudinal axes of their fin structures 901*a*, 901*b* are shown in FIG. 9. For illustrative purposes, here and in the following figures, the field effect transistors 900*a*, 900*b* are in each case shown with only one fin structure. However, in accordance with some embodiments at least one of the field effect transistors 900*a*, 900*b* may have more than one fin structure. For example, at least one of the field effect transistors 900*a*, 900*b* may have a multi-fin structure including a plurality or a multiplicity of fin structures electrically connected in parallel.

The field effect transistor 900*a* to be protected includes a first source/drain region 902*a* and a second source/drain region 903*a* which are each electrically contacted by electrical contacts 905*a* formed on the source/drain regions 902*a* and 903*a*, respectively. A fin structure (fin) 901*a* is formed between the first source/drain region 902*a* and the second source/drain region 903*a*. The source/drain regions 902*a*, 903*a* and the fin structure 901*a* are formed on a buried oxide (BOX) layer 921*a*. In accordance with some embodiments, the electronic circuit 900' includes a substrate, for example, an SOI substrate, and the buried oxide region 921*a* may correspond to a buried oxide layer of the SOI substrate, while the source/drain regions 902*a*, 903*a* and the fin structure 901*a* may be formed in a thin silicon layer disposed on the buried oxide layer 921*a* of the SOI substrate.

The field effect transistor 900*a* further includes a gate region 904*a* formed on the upper surface 901*a'* and on the sidewalls 901*a''* of the fin structure 901*a* (cf. FIG. 10A). The gate region 904*a* includes a gate-insulating layer 904*a'* (in other words, a gate dielectric). The gate-insulating layer 904*a'* may include or may be made of a suitable dielectric material such as, for example, silicon oxide or other suitable dielectric materials. The gate region 904*a* further includes a conductive gate layer 904*a''* formed on the gate-insulating layer 904*a'*. The conductive gate layer 904*a''* may include a suitable electrically conductive material such as, for example, polysilicon (poly-Si) or other suitable gate materials. The field effect transistor 900*a* further includes gate spacers 910*a* formed on the sidewalls of the gate region 904*a*. The gate spacers 910*a* may be made of or may include a suitable electrically insulating material such as, for example, silicon nitride or other suitable spacer materials.

The field effect transistor 900*a* to be protected has a dopant profile that is characterized by a first region 913*a* and a second region 914*a* of the transistor 900*a* having a dopant concentration of approximately greater than $10^{19}$ cm$^{-3}$, a third region 915*a* and a fourth region 916*a* of the transistor 900*a* having a dopant concentration of about $10^{18}$ cm$^{-3}$ to about $10^{19}$ cm$^{-3}$, a fifth region 917*a* and a sixth region 918*a* of the transistor 900*a* having a dopant concentration of about $10^{17}$ cm$^{-3}$ to about $10^{18}$ cm$^{-3}$, a seventh region 919*a* and an eighth region 920*a* of the transistor 900*a* having a dopant concentration of about $10^{16}$ cm$^{-3}$ to about $10^{17}$ cm$^{-3}$, and a ninth region 922*a* of the transistor 900*a* having a dopant concentration of approximately less than $10^{16}$ cm$^{-3}$.

In accordance with other embodiments, at least one of the regions 913*a*, 914*a*, 915*a*, 916*a*, 917*a*, 918*a*, 919*a*, 920*a*, and 922*a* may have a different shape and/or a dopant concentration in a range that is different from the one(s) described above.

The first region 913*a* corresponds to the highly doped first source/drain region 902*a* and further to a highly doped portion of the fin structure 901*a* located between the first source/drain region 902*a* and the gate region 904*a* of the field effect transistor 900*a*, while the second region 914*a* corresponds to the highly doped second source/drain region 902*a* and a highly doped portion of the fin structure 901*a* located between the second source/drain region 903*a* and the gate region 904*a* of the field effect transistor 900*a*.

The field effect transistor 900*a* further includes a first extension region 911*a* and a second extension region 912*a* located within the fin structure 901*a* and below the gate sidewall spacers 910*a*, and the doped regions 915*a*, 916*a*, 917*a*, 918*a*, 919*a*, 920*a*, and 922*a* correspond to portions of the first extension region 911*a*, the second extension region 912*a* and a channel region formed within the fin structure 901*a* and below the gate region 904*a* of the transistor 900*a*.

In accordance with some embodiments, the dopant concentration in the doped regions 913*a*, 914*a*, 915*a*, 916*a*, 917*a*, 918*a*, 919*a*, 920*a*, and 922*a* may be achieved by means of one or more dopant implantations, such as, for example, an extension implantation (e.g., a tilted extension implantation) and a source/drain implantation in accordance with one embodiment, as is described herein below in connection with FIG. 10A to FIG. 10E. In this regard, it is noted that the dopant concentration in the fin structure 901*a* clearly has a gradient along the longitudinal direction or axis of the fin structure 901*a* in those portions of the fin structure 901*a* that are located below the gate spacers 910*a*, in other words in the extension regions 911*a*, 912*a* of the field effect transistor 900*a*.

Clearly, in accordance with an embodiment, in the extension regions 911*a*, 912*a* of the field effect transistor 900*a*, the dopant concentration decreases from a high value that is achieved in the source/drain regions 902*a*, 903*a* to a lower dopant concentration level that is achieved in the region 922a of the fin structure 901a located below the gate region 904a, in other words in a channel region of the field effect transistor 901a.

In this connection it is noted, that the shape of the dopant profile, and in particular the shape of the dopant profile in the extension regions 911a, 912a of the field effect transistor 900a is represented only schematically by the regions 915a, 916a, 917a, 918a, 919a and 920a. In particular, it is noted that the gradient or decrease of the dopant concentration in the extension regions 911a, 912a does not have to occur in a stepwise manner as could be inferred from FIG. 9, but may rather occur in a continuous or smooth manner.

In addition to the gradient of the dopant profile in a lateral direction (that is, in the direction of the longitudinal axis of the fin structure 901a), a gradient of the dopant concentration in the extension regions 911a, 912a may also occur in the direction from the outer surface of the fin structure 901a towards the core of the fin structure 901a, as will be described herein below in connection with FIG. 10D.

Furthermore, pn-junctions 923a formed in the extension regions 911a, 912a of the field effect transistor 900a, are indicated in FIG. 9.

The protection field effect transistor 900b of the electronic circuit 900' includes a first source/drain region 902b and a second source/drain region 903b, and a fin structure 901b formed between the source/drain regions 902b, 903b and electrically connecting the source/drain regions 902b, 903b. The protection field effect transistor 900b is formed on a buried oxide (BOX) region 921b which may correspond to a buried oxide layer of the SOI substrate of the electronic circuit 900'. In this case, the source/drain regions 902b, 903b and the fin structure 901b may be formed from or in a silicon layer of the SOI substrate.

The first source/drain region 902b and the second source/drain region 903b are each electrically contacted by electrical contacts 905b formed thereon.

Figure 11A:
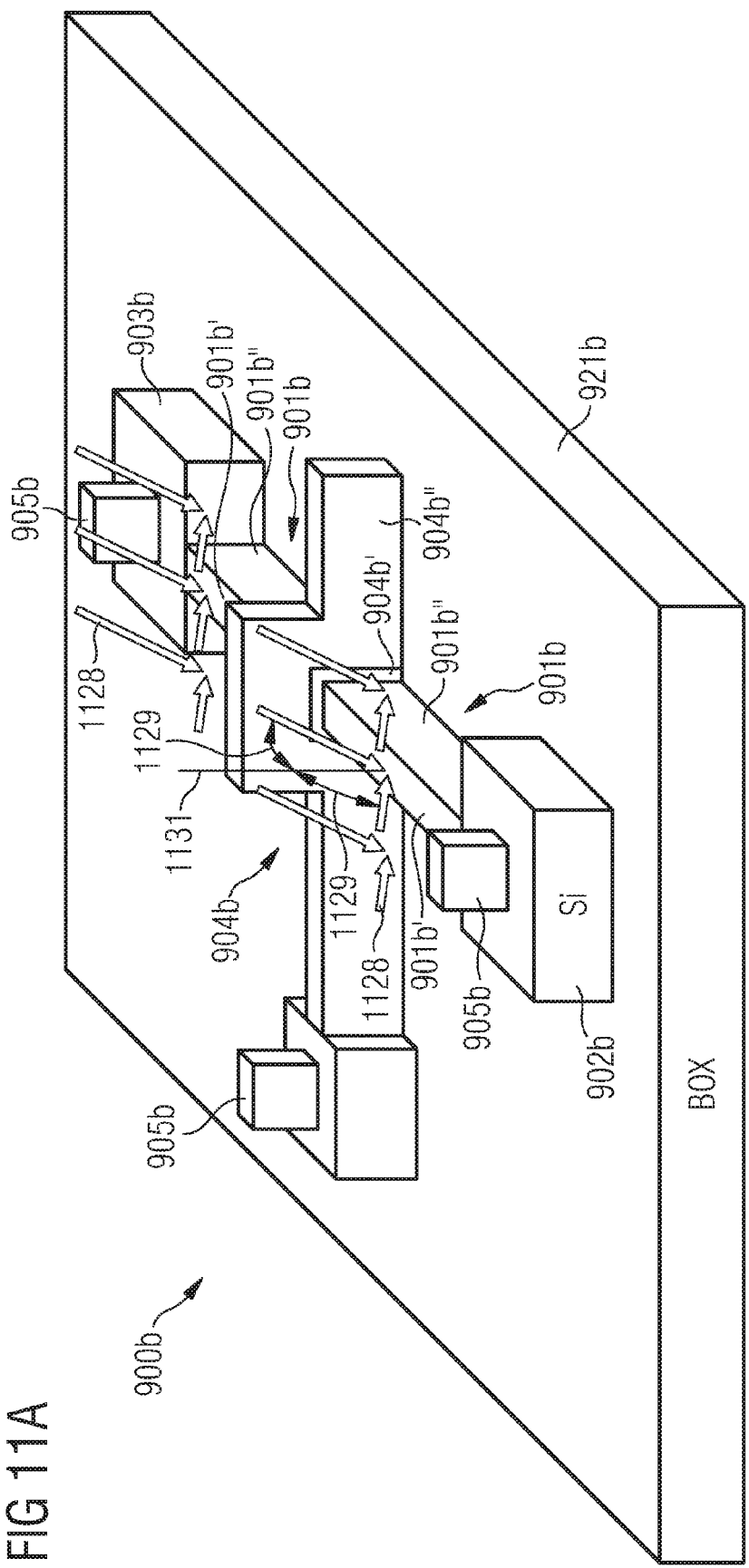

The protection field effect transistor 900b further includes a gate region 904b that is formed on the upper surface 901b' and on the sidewalls 901b" of the fin structure 901b of the protection field effect transistor 900b (cf. FIG. 11A). The gate region 904b includes a gate-insulating layer 904b', in other words a gate dielectric layer, formed on the upper surface 901b' and on the sidewalls 901b" of the fin structure 901b. The gate-insulating layer 904b' may include or may be made of a suitable dielectric material such as, for example, silicon oxide, or any other suitable gate dielectric material. The gate region 904b further includes a conductive gate layer 904b" that is formed on the gate-insulating layer 904b'. The conductive gate layer 904b" may include or may be made of a suitable electrically conductive material such as, for example, polysilicon (poly-Si) or any other suitable gate material.

The protection field effect transistor 900b further includes gate sidewall spacers 910b formed on the sidewalls of the gate region 904b. The spacers 910b may include or may be made of a suitable spacer material such as, for example, silicon nitride or any other suitable spacer material.

The protection field effect transistor 900b has a dopant profile that is characterized by a first region 913b and a second region 914b of the transistor 900b having a dopant concentration of approximately greater than $10^{19}$ cm$^{-3}$, a third region 915b and a forth region 916b of the transistor 900b having a dopant concentration of approximately $10^{18}$ cm$^{-3}$ to $10^{19}$ cm$^{-3}$, a fifth region 917b and a sixth region 918b of the transistor 900b having a dopant concentration of approximately $10^{17}$ cm$^{-3}$ to $10^{18}$ cm$^{-3}$, a seventh region 919b and an eighth region 920b of the transistor 900b having a dopant concentration of approximately $10^{16}$ cm$^{-3}$ to $10^{17}$ cm$^{-3}$, and a ninth region 922b of the transistor 900b having a dopant concentration of approximately less than $10^{16}$ cm$^{-3}$.

In accordance with other embodiments, at least one of the regions 913b, 914b, 915b, 916b, 917b, 918b, 919b, 920b, and 922b may have a different shape and/or a dopant concentration in a range that is different from the one(s) described above.

The first region 913b corresponds to the highly doped first source/drain region 902b and further to a highly doped portion of the fin structure 901b located between the first source/drain region 902b and the gate region 904b of the protection field effect transistor 900b, while the second region 914b corresponds to the highly doped second source/drain region 903b and a highly doped portion of the fin structure 901b located between the second source/drain region 903b and the gate region 904b of the protection field effect transistor 900b.

The protection field effect transistor 900b further includes a first extension region 911b and a second extension region 912b located within the fin structure 901b and below the gate sidewall spacers 910b, and the doped regions 915b, 916b, 917b, 918b, 919b, 920b, and 922b correspond to portions of the first extension region 911b, the second extension region 912b and a channel region formed within the fin structure 901b and below the gate region 904b.

It is shown in FIG. 9, that the dopant profile in the fin structure 901b of the protection field effect transistor 900b has curved junctions 923b' formed within upper portions of the extension regions 911b, 912b and the channel region, and further has abrupt junctions 923b" (in other words, junctions with a steep dopant concentration gradient) formed within lower portions of the extension regions 911b, 912b.

Furthermore, it is shown in FIG. 9, that the dopant profile in the extension regions 911b, 912b of the protection field effect transistor 900b is different from the dopant profile in the respective extension regions 911a, 912a of the field effect transistor 900a to be protected. In accordance with the embodiment shown in FIG. 9, the protection field effect transistor 900b has a more abrupt and more curved dopant profile than the field effect transistor 900a to be protected. One effect of this different dopant profile is a lower ESD trigger voltage of the protection field effect transistor 900b such that the protection field effect transistor 900b may be used as an ESD protection device in the electronic circuit 900' in order to protect the field effect transistor 900a against electrostatic discharge events. The lower ESD trigger voltage of the protection field effect transistor 900b compared to the field effect transistor 900a clearly may lead to a preferred current path through the protection field effect transistor 900b during an ESD event.

In this connection it is noted, that the shape of the dopant profile, and in particular the shape of the dopant profile in the extension regions 911b, 912b of the protection field effect transistor 900b is represented only schematically by the regions 915b, 916b, 917b, 918b, 919b and 920b. In particular, it is noted that the gradient or decrease of the dopant concentration in the curved junctions 923b' and/or in the abrupt junctions 923b" does not have to occur in a stepwise manner as could be inferred from FIG. 9, but may rather occur in a continuous or smooth manner.

In accordance with some embodiments, the dopant profile in the protection field effect transistor 900b may be obtained by one or more dopant implantations such as, for example, an extension implantation (e.g., a tilted extension implantation) and a source/drain implantation in accordance with one embodiment, as will be described herein below in connection with FIG. 11A to FIG. 11F.

In accordance with some embodiments, the difference in the dopant profiles of the protection field effect transistor 900b and the field effect transistor 900a may result from the use of different implantation orientations or directions in a tilted implantation, as will be described herein below.

In accordance with some embodiments, the field effect transistor 900a to be protected may be configured as a functional field effect transistor, for example, as an input/output driver field effect transistor in accordance with one embodiment, or as a logic field effect transistor in accordance with another embodiment.

In accordance with another embodiment, the protection field effect transistor 900b is coupled to the field effect transistor 900a to be protected, to provide ESD protection thereof.

In the following, different stages in a method of manufacturing the electronic circuit 900' in accordance with an embodiment of the invention will be described with reference to FIG. 10A to FIG. 11F. In particular, the formation of the different dopant profiles of the field effect transistors 900a and 900b of the electronic circuit 900' will be described in detail.

In accordance with an embodiment, a method of manufacturing the electronic circuit 900' includes forming the field effect transistor 900a that is to be protected against electrostatic discharge events, in or on a substrate (for example, an in or on an SOI substrate), and forming the protection field effect transistor 900b in or on the substrate. The field effect transistor 900a (similarly, the protection field effect transistor 900b) may be formed, for example, by forming the fin structure 901a and the source/drain regions 902a, 903a of the transistor 900a in a thin silicon layer of an SOI substrate in a known manner, and also forming a gate region 904a on the fin structure 901a in a known manner.

The method of manufacturing the electronic circuit 900' further includes implanting first dopant implants at least into an extension region of the field effect transistor 900a to be protected, and implanting second dopant implants at least into an extension region of the protection field effect transistor 900b, wherein the implantation of the first and second dopant implants is carried out in such a manner that the extension region of the field effect transistor 900a to be protected has a first dopant profile and that the extension region of the protection field effect transistor 900b has a second dopant profile different from the first dopant profile.

FIG. 10A shows a perspective view of the field effect transistor 900a, illustrating a first implantation 1028 wherein first dopant implants are implanted into the sidewalls 901a" and into the top surface 901a' of the fin structure 901a of the field effect transistor 900a. The first implantation 1028 is configured as a tilted implantation having a tilt angle 1029 with respect to the surface normal 1031 (that is, with respect to the direction perpendicular to the top surface 901a' of the fin structure 901a or the main processing surface of the substrate). In principle, the tilt angle 1029 may be any angle from 0° to 90°, for example, from about 10° to about 70° in accordance with some embodiments, e.g., 45° in one embodiment.

In accordance with the embodiment shown in FIG. 10A, the first implantation 1028 is configured as a tilted 2-quad implantation, that is, as an implantation from two opposite quadrants of a two-dimensional Cartesian coordinate system that coincides with the surface plane.

Figure 10B:
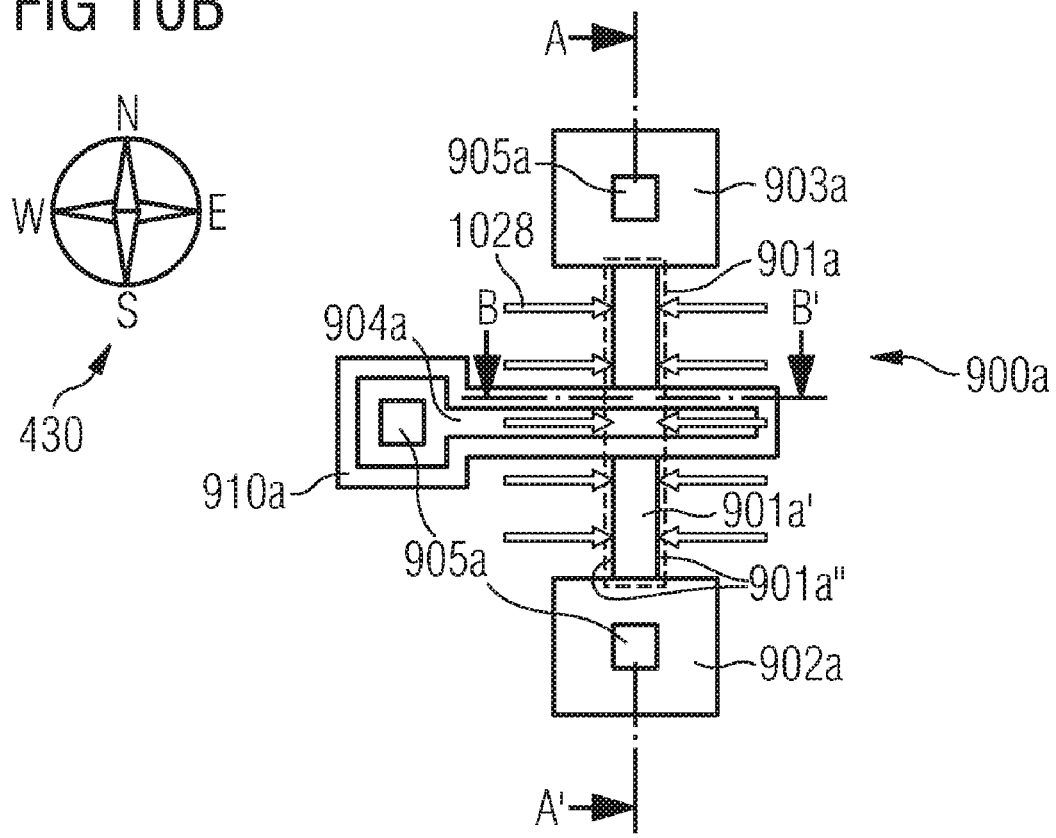
FIGS. 10A to 11F show different stages in a method of manufacturing an electronic circuit in accordance with an embodiment of the invention.

It is shown in FIG. 10A and FIG. 10B that the first implantation 1028 is carried out in such a manner that the implantation direction of the first dopant implants is perpendicular with respect to the longitudinal direction or axis of the fin structure 901a and tilted with respect to a sidewall normal of the fin structure 901a (that is, with respect to a direction perpendicular to the sidewalls 901a" of the fin structure 901a) of the field effect transistor 900a to be protected.

In accordance with an embodiment, the first implantation 1028 may be configured as a tilted extension implantation that is carried out before the formation of gate sidewall spacers 910a of the field effect transistor 900a, as is shown in FIG. 10A.

FIG. 10B shows a top view of the field effect transistor 900a together with the compass rose 430 indicating orientations on the substrate (for example, orientations on a wafer). It is shown, that the fin structure 901a of the field effect transistor 900a is orientated along the north-to-south orientation, and that the first implantation 1028 (or, more precisely, its projection into the surface plane) is orientated along the west-to-east direction and along the east-to-west direction. In other words, the orientation of the fin structure 901a of the field effect transistor 900a is north-to-south, and the first implantation 1028 is effected from the east and from the west.

Figure 10C:
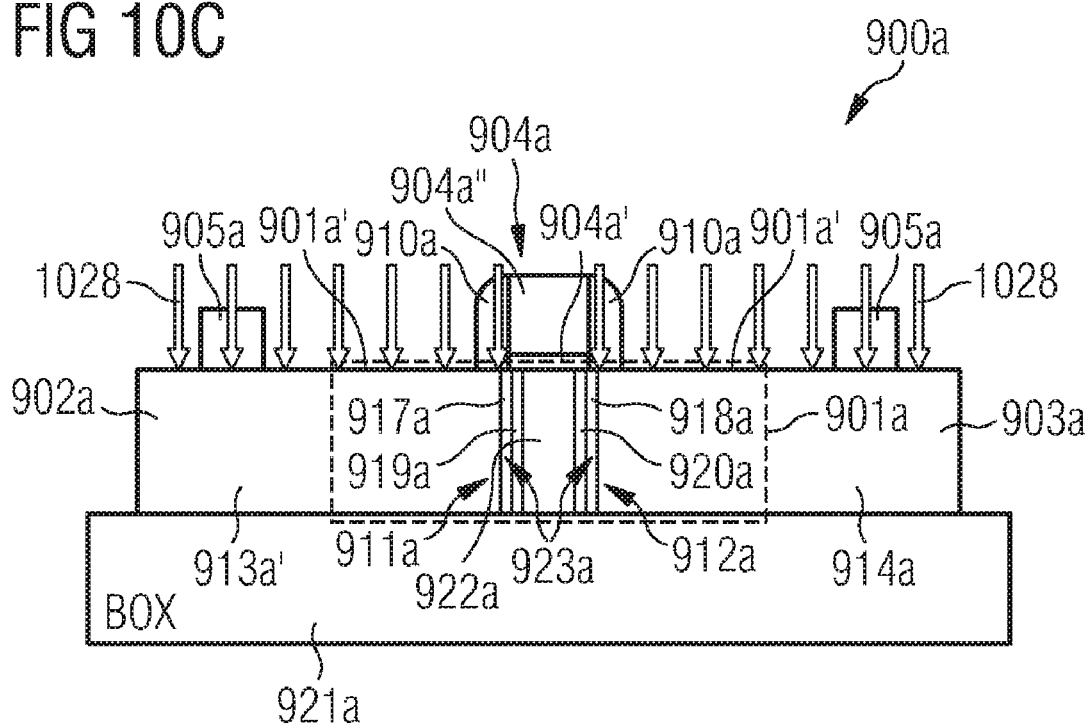

FIG. 10C shows a cross-sectional view of the field effect transistor 900a along the line A-A' shown in FIG. 10B, that is a cross-section of the field effect transistor 900a along the longitudinal axis of its fin structure 901a. It is shown the first implantation 1028 (or, more precisely, its projection into the plane of the cross-section), that is the implantation of the first dopant implants into the sidewalls 901a" and into the top surface 901a' of the fin structure 901a furthermore into the first and second source/drain regions 902a, 903a of the field effect transistor 900a. The first implantation 1028 may be carried out after the formation of the gate region 904a, so that the gate region 904a serves as a mask during the implantation.

In accordance with one embodiment, by means of the first implantation 1028 a dopant profile is formed within the fin structure 901a and the source/drain regions 902a and 903a, which is characterized by the fifth region 917a, the sixth region 918a, the seventh 919a, the eight region 920a and the ninth region 922a of the transistor 900a having the dopant concentrations as described above in connection with FIG. 9, and a dopant concentration of about $10^{18}$ cm$^{-3}$ to about $10^{19}$ cm$^{-3}$ being formed in a tenth region 913a' and an eleventh region 914a' of the transistor 900a, wherein the tenth region 913a' corresponds to the combination of the first region 913a and the third region 915a described above, and wherein the eleventh region 914a' corresponds to the combination of the second region 914a and the fourth region 916a described above.

Furthermore, by means of the first implantation 1028, junctions 923a are formed within the fin structure 901a below the gate region 904a of the field effect transistor 900a.

FIG. 10C furthermore shows that spacers 910a are formed on the sidewalls of the gate region 904a. In accordance with some embodiments, the sidewall spacers 910a are formed after the implantation 1028 of the first dopant implants.

FIG. 10D shows a cross-sectional view of the field effect transistor 900a along the line B-B' shown in FIG. 10B, that is a transversal cross-section through the fin structure 901a of the field effect transistor 900a or, more precisely, through the second extension region 912a of the transistor 900a. It is shown the implantation 1028 of the first dopant implants into the sidewalls 901a" and into the top surface 901a' of the fin structure 901a. Furthermore, it is shown that the first implantation 1028 is effected under a tilt angle 1029.

It is shown that by means of the first implantation 1028 a dopant gradient from the outer surface of the fin structure 901a towards the core of the fin structure 901a is formed within the second extension region 912a. In other words, the dopant concentration in the second extension region 912a decreases in the direction from the outer surface of the fin structure 901a towards the core of fin structure 901a. In FIG. 10D, this decrease in the dopant concentration is represented schematically by an outer region 912a' of the second extension region 912a having a dopant concentration from about $10^{18}$ cm$^{-3}$ to about $10^{19}$ cm$^{-3}$, a middle region 912a" of the second extension region 912a having a dopant concentration of about $10^{17}$ cm$^{-3}$ to about $10^{18}$ cm$^{-3}$, and a core region 912a''' of the second extension region 912a having a dopant concentration of about $10^{16}$ cm$^{-3}$ to about $10^{17}$ cm$^{-3}$.

It is noted that the regions 912a', 912a", and 912a''' and their respective dopant concentrations described above only serve as an exemplary illustration of the decrease of the dopant concentration within the extension region 912a. In particular, this decrease does not have to occur in a stepwise manner as could be inferred from FIG. 10D, but may rather occur in a smooth or continuous manner in accordance with some embodiments of the invention. Furthermore, different dopant concentrations may be formed in the individual regions.

FIG. 10D furthermore shows the gate spacer 910a that is formed on the sidewalls 901a" and on the top surface 901a' of the fin structure 901a over the second extension region 912a. In accordance with one embodiment, the gate spacer 910a is formed after the implantation 1028 of the first dopant implants.

It is noted, that a similar dopant profile as the one shown in FIG. 10D is obtained in the first extension region 911a of the field effect transistor 901a.

FIG. 10E shows another cross-sectional view of the field effect transistor 900a along the line A-A' shown in FIG. 10B. It is shown the implantation 1030 of source/drain implants into the fin structure 901a and into the source/drain regions 902a, 903a of the field effect transistor 900a, thereby obtaining the dopant profile characterized by the doped regions 913a, 914a, 915a, 916a, 917a, 918a, 919a, 920a and 922a having the dopant concentrations as described herein above in connection with FIG. 9. In particular, by means of the source/drain implantation 1030 highly doped source/drain regions 902a, 903a are formed in the field effect transistor 900a. The source/drain implantation 1030 may be carried out as an essentially perpendicular implantation that is having an implantation vector that is essentially parallel to the surface normal 1031. Alternatively, the source/drain implantation 1030 may be configured as a tilted implantation with a tilt angle of up to about 10°.

FIG. 11A shows a perspective view of the protection field effect transistor 900b, illustrating a second implantation 1128 wherein second dopant implants are implanted into the fin structure 901b of the protection field effect transistor 900b. The second implantation 1128 is configured as a tilted implantation having a tilt angle 1129 with respect to the surface normal 1131 (that is, with respect to the direction perpendicular to the upper surface of the fin structure 901b or the main processing surface of the substrate). In principle, the tilt angle 1129 may be any angle from 0° to 90°, for example, from about 10° to about 70° in accordance with some embodiments, e.g., 45° in one embodiment.

In accordance with an embodiment, the second implantation 1128 may be configured as a tilted extension implantation and may be carried out before the formation of gate sidewall spacers 910b of the protection field effect transistor, as is shown in FIG. 11A.

Furthermore, as is shown in FIG. 11A, the second dopant implants 1128 are implanted into the fin structure 901b of the protection field effect transistor 900b from a direction that is approximately perpendicular to the sidewall normal. In other words, the implantation vector of the second implantation 1128 lies within a two-dimensional plane that is parallel to the sidewalls 901b" of the fin structure 901b. Therefore, the second dopant implants 1128 are implanted only (or almost only) into the upper surface 901b' of the fin structure 901b, but not (or only to a comparatively minor percentage) into the sidewalls 901b" of the fin structure 901b. In other words, the dopant implants of the second implantation 1128 only (or almost only) hit the upper surface 901b' of the fin structure 901b but not its sidewalls 901b". Thus, a different dopant profile may be achieved within the fin structure 901b of the protection field effect transistor 900b, and in particular within the extension regions 911b, 912b of the protection field effect transistor 900b as described herein below.

Figure 11B:
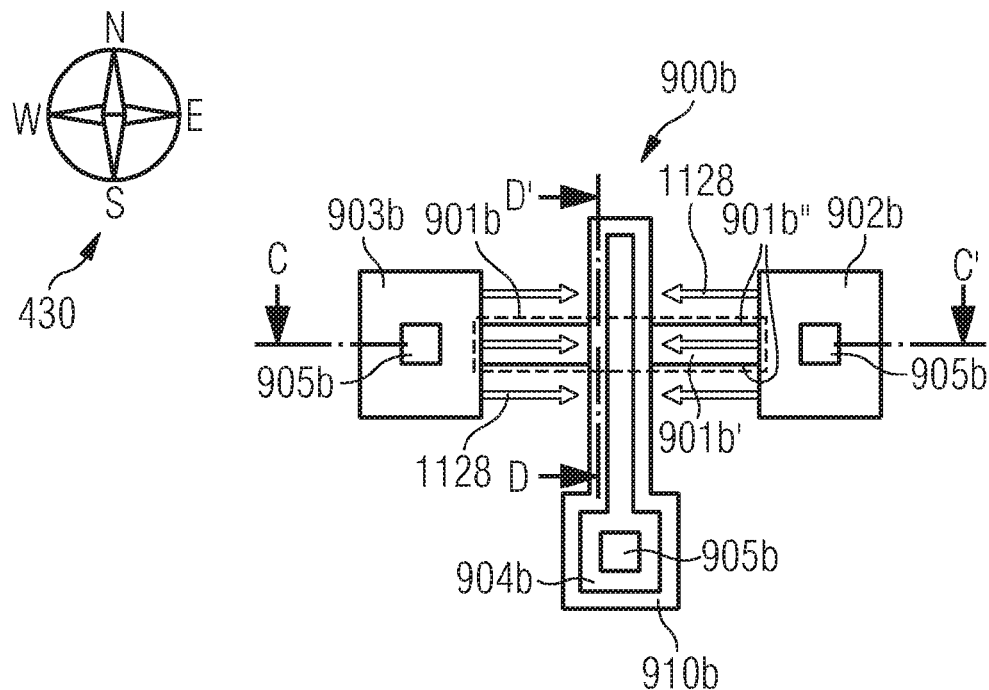
Figure 11C:
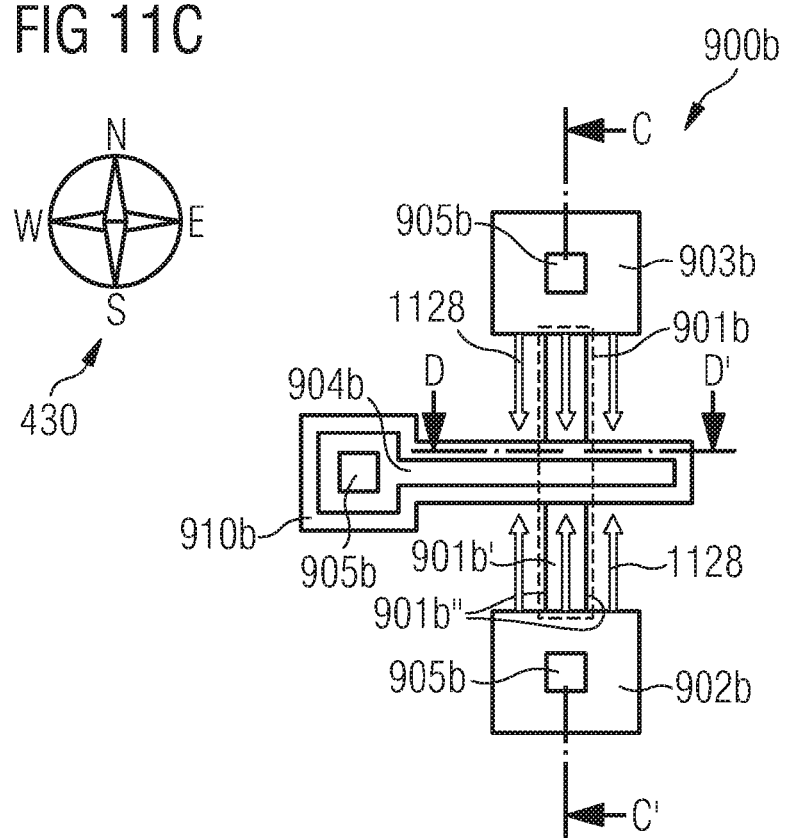

With respect to FIG. 11B and FIG. 11C, different possibilities of achieving the different implantation direction or orientation for the second implantation 1128 with respect to the direction or orientation of the first implantation 1028 are described in accordance with some embodiments of the invention. FIG. 11B and FIG. 11C in each case show a top view of the protection field effect transistor 900b in a similar manner as FIG. 10B.

In accordance with the embodiment shown in FIG. 11B, the protection field effect transistor 900b is rotated by a rotation angle of 90° with respect to the field effect transistor 900a shown in FIG. 10B, while the second implantation 1128 has the same orientation as the first implantation 1028 with respect to the reference system provided by the compass rose 430. In other words, while the implantation vector of the second implantation 1128 (or, more precisely, its projection into the surface plane) is still orientated along the west-to-east-direction and along the east-to-west-direction, the fin structure 901b of the protection field effect transistor 900b now also is orientated along the west-to-east-direction, such that the implantation vector of the second implantation 1128 is parallel to the sidewalls 901b" of the fin structure 901b (and the projection of the implantation vector into the surface plane is parallel to the longitudinal direction or axis of the fin structure 901b), whereas in the case of the first implantation 1028, the projection of the implantation vector into the surface plane was perpendicular to the sidewalls 901a" of the fin structure 901a of the field effect transistor 900a (cf. FIG. 10B).

In accordance with one embodiment, the rotation of the protection field effect transistor 900b with respect to the field effect transistor 900a may be achieved, for example, by forming the protection field effect transistor 900b at a different angle (that is, rotated by 90°) on the substrate (e.g., on the wafer), for example, using a rotated layout for the protection field effect transistor 900b. In this case, the first implantation 1028 of the first dopant implants into the fin structure 901a of the field effect transistor 900a may be carried out at the same time as the second implantation 1128 of the second dopant implants into the fin structure 901b of the protection field effect transistor 900b, thereby achieving different dopant profiles within the two transistors 900a, 900b due to the different orientations of their fin structures 901a, 901b on the substrate. In accordance with one embodiment, the first implantation 1028 and the second implantation 1128 may be carried out using an implantation apparatus. In accordance with another embodiment, the first implantation 1028 and the second implantation 1128 may be configured as a tilted 2-quad implantation from west and east.

In accordance with an alternative embodiment, the protection field effect transistor 900b may be formed such that it is has the same orientation on the substrate as the field effect transistor 900a shown in FIG. 10B (that is, a north-to-south orientation of its fin structure 901b). In this case, the first implantation 1028 may be carried out first with the protection field effect transistor 900b being shielded from the first implants (for example, by means of a mask), such that the dopant profile shown in FIG. 10C and FIG. 10D is achieved in the field effect transistor 900a while the protection field effect transistor 900b remains essentially undoped. After the first implantation 1028, the substrate (for example, the wafer) with the field effect transistors 900a, 900b formed thereon may be rotated by a rotation angle of 90°, such that the fin structure 901b of the protection field effect transistor 900b (and also the fin structure 901a of the field effect transistor 900a) now has a west-to-east orientation. Then, the second implantation 1128 may be carried out with the field effect transistor 900a being shielded from the second dopant implants (for example, by means of a mask) and the shielding (for example, the mask) of the protection field effect transistor 900b having been removed before implanting the second dopant implants 1128, such that the dopant profile shown in FIG. 11D and FIG. 11E is achieved in the protection field effect transistor 900b.

In accordance with another embodiment, the implantation sequence may be reversed. In other words, the implantation of the second dopant implants into the protection field effect transistor 900b may be carried out before the implantation of the first dopant implants into the field effect transistor 900a to be protected.

In accordance with an alternative embodiment shown in FIG. 11C, the protection field effect transistor 900b may be formed on the substrate along the north-to-south-direction, that is having the same orientation as the field effect transistor 900a shown in FIG. 10B. More precisely, the fin structure 901b of the protection field effect transistor 900b is orientated in the same way as the fin structure 901a of the field effect transistor 900a to be protected.

In accordance with the embodiment shown in FIG. 11C, an implantation apparatus that is used to carry out the first implantation 1028 and the second implantation 1128 is rotated by 90° before the second implantation 1128 is carried out. In accordance with one embodiment, the first dopant implants are implanted into the field effect transistor 900a using the implantation apparatus and a tilted 2-quad implantation from west and east, while shielding the protection field effect transistor 900b. Subsequently, having carried out the first implantation 1028, the implantation apparatus is rotated (with respect to the substrate and the transistors 900a, 900b formed thereon) and the second dopant implants are implanted into the protection field effect transistor 900b using the same implantation apparatus but with a different implantation direction (for example, from north and south in accordance with the embodiment shown in FIG. 11C).

In accordance with alternative embodiments, the implantation sequence may be reversed. In other words, the implantation of the second dopant implants into the protection field effect transistor 900b may be carried out before the implantation of the first dopant implants into the field effect transistor 900a to be protected.

It is noted that, in accordance with alternative embodiments, different implantation orientations may be applied or achieved in the implantation of the first and/or second dopant implants, for example, by means of forming the transistors at different angles on the substrate and/or using different rotation angles for the rotation of the substrate and/or using different rotation angles for the rotation of the implantation apparatus. Thus, different implantation or dopant profiles may be achieved, for example, complex three-dimensional (3D) or distorted dopant profiles (see, for example, FIG. 12 and the description thereof herein below).

FIG. 11D and FIG. 11E show a dopant profile that is achieved in the protection field effect transistor 900b by means of the second implantation 1128.

FIG. 11D shows a cross-sectional view of the protection field effect transistor 900b along the line C-C' shown in FIG. 11B and FIG. 11C, that is a cross-section of the protection field effect transistor 900b along the longitudinal axis of its fin structure 901b. It is shown the second implantation 1128 having a tilt angle 1129 with respect to the surface normal 1131 and having an implantation that lies in a plane that is parallel to the sidewalls 901b" of the fin structure 901b, such that the second dopant implants are implanted into the top surface 901b' of the fin structure 901b but not (or almost not) into its sidewalls 901b" as described herein above.

By means of the second implantation 1128 a dopant profile is achieved in the protection field effect transistor 900b, which is characterized by regions 915b' and 916b' of the protection field effect transistor 900b having a dopant concentration of about $10^{18}$ cm$^{-3}$ to about $10^{19}$ cm$^{-3}$, regions 917b' and 918b' of the transistor 900b having a dopant concentration of about $10^{17}$ cm$^{-3}$ to about $10^{18}$ cm$^{-3}$, regions 919b' and 920b' of the transistor 900b having a dopant concentration of about $10^{16}$ cm$^{-3}$ to about $10^{17}$ cm$^{-3}$, and a region 922b' of the transistor 900b having a dopant concentration of approximately less than $10^{16}$ cm$^{-3}$, as is shown in FIG. 11D.

It is shown that by means of the second implantation 1128 a dopant profile is achieved within the protection field effect transistor 900b that decreases from the upper surface of the transistor 900b to the bottom of the transistor 900b. Furthermore, curved junctions 923b' are formed within the fin structure 901b below the gate region 904b. The dopant profile that is obtained in the protection field effect transistor 900b by means of the second implantation 1128 is clearly different from the dopant profile that is obtained in the field effect transistor 900a by means of the first implantation 1028. The difference in the dopant profiles may be attributed to the fact that in the second implantation 1128, the second dopant implants are only (or almost only) hitting the top surface 901b' of the fin structure 901b but not (or almost not) its sidewalls 901b". Thus, the dopant concentration in the fin structure 901b decreases from the top to the bottom of the transistor 900b, as only a minor percentage of the second dopant implants 1128 reaches down to the bottom of the fin structure 901b.

Furthermore, the gate region 904b of the transistor 900b has a shading effect on the second implantation 1128 which contributes to the formation of the curved junctions 923b' within the fin structure 901b below the gate region 904b.

FIG. 11E shows a cross-sectional view of the protection field effect transistor 900b along the line D-D' shown in FIG. 11B and FIG. 11C, that is a transversal cross-section through that part of the fin structure 901b that corresponds to the second extension region 912b of the protection field effect transistor 900b. FIG. 11E shows that the second dopant implants of the second implantation 1128 only (or almost only) hit the top surface 901b' of the fin structure line 901b but not (or only to a minor percentage) the sidewalls 901b" of the fin structure 901b. Thus, a different dopant profile is achieved within the second extension region 912b of the fin structure 901b compared to the dopant profile of the second extension region 912a of the field effect transistor 900a obtained after the first implantation 1028 (cf. FIG. 10D).

In particular, FIG. 11E shows the decrease of the dopant concentration in the second extension region 912b from the top to the bottom of the fin structure 901b. Furthermore, FIG.

11D and FIG. 11E show that a gate spacer 910b is formed on the top surface 901b' and on the sidewalls 901b" of the fin structure 901b adjacent to the gate region 904b. In accordance with some embodiments, the gate spacer 910b is formed after the second implantation 1128.

It is noted that a similar dopant profile as the one shown in the cross-sectional view of FIG. 11E is obtained in the first extension region 911b of the protection field effect transistor 900b.

Figure 11F:
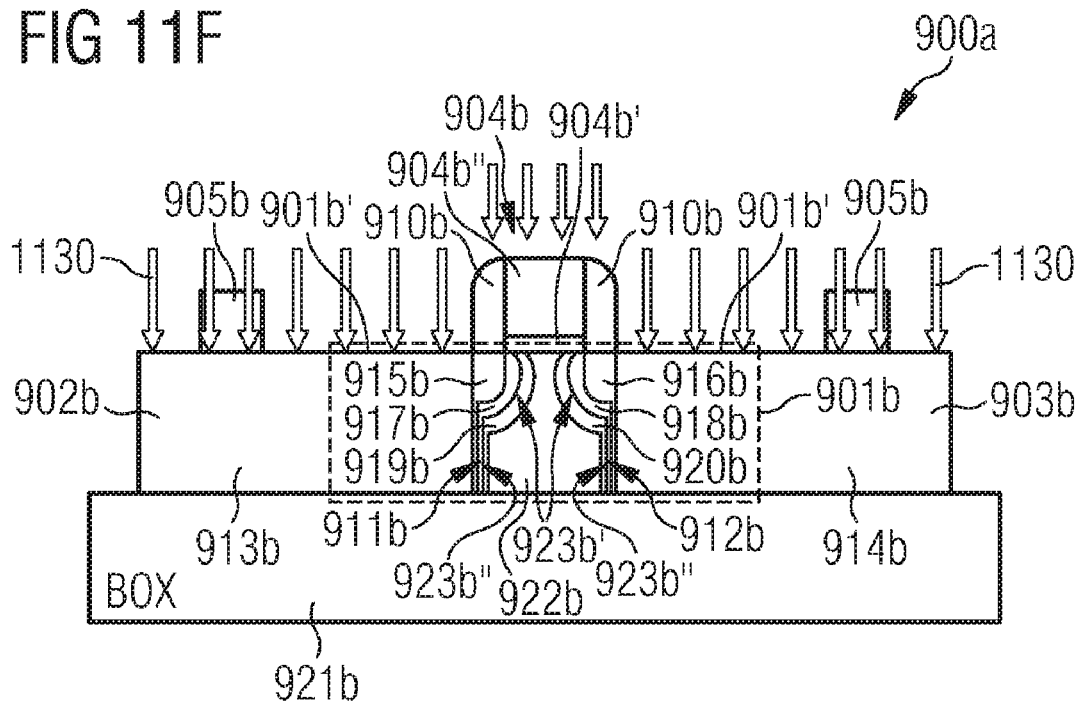

FIG. 11F shows another cross-sectional view of the protection field effect transistor 900b along the line C-C' shown in FIG. 11B and FIG. 11C. It is shown a source/drain implantation 1130, which is carried out in a similar manner as the source/drain implantation 1030 shown in FIG. 10E. By means of the source/drain implantation 1130 the dopant profile characterized by the doped regions 913b, 914b, 915b, 916b, 917b, 918b, 919b, 920b, and 922b with the dopant concentrations as described herein above in connection with FIG. 9, is obtained in the fin structure 901b and the source/drain regions 902b, 903b of the protection field effect transistor 900b. In particular, curved junctions 923b' are formed within upper portions of the extension regions 911b, 912b, and abrupt junctions 923b" are formed within lower portions of the extension regions 911b, 912b as shown in FIG. 11F.

One effect of the dopant profile having the curved junctions 923b' and the abrupt junctions 923b" is, that the protection field effect transistor 900b has a lower ESD trigger voltage than the field effect transistor 900a to be protected. Therefore, the protection field effect transistor 900b may be used as an ESD protection device for protecting the field effect transistor 900a (e.g., a functional field effect transistor) against electrostatic discharge events.

One effect of the difference between the implantation orientation of the first implantation 1028 and the implantation orientation of the second implantation 1128 is that in the first implantation 1028, the fin structure 901a of the field effect transistor 900a receives dopant implants (for example, extension implants) from the "side" so that the fin structure 901a is implanted uniformly from the top to the bottom, whereas in the second implantation 1128 hardly any dopant implants (for example, extension implants) will go into the device with the exception of the upper fin surface. Thus, the field effect transistor 900a and the protection field effect transistor 900b may have different dopant profiles as described herein above.

Figure 12:
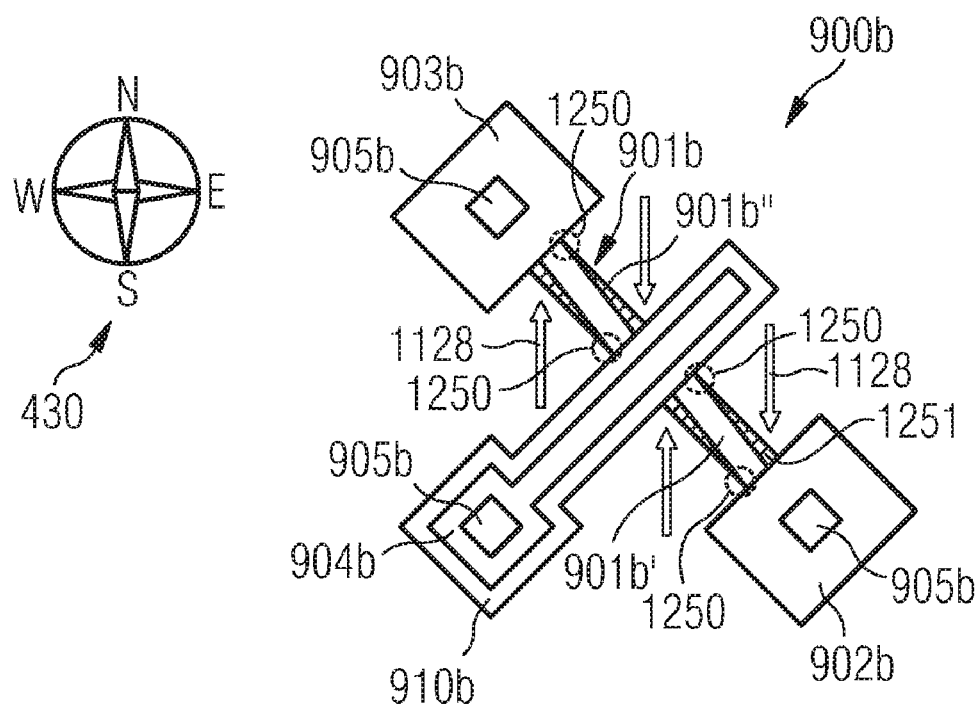
FIG. 12 shows an implantation of dopant implants into a field effect transistor in accordance with an embodiment of the invention.

FIG. 12 shows the second implantation 1128, that is the implantation of the second dopant implants into the fin structure 901b of the protection field effect transistor 900b in accordance with another embodiment of the invention. In this embodiment, the protection field effect transistor 900b is rotated by a rotation angle of 45° with respect to the orientation of the field effect transistor 900a to be protected, such that the fin structure 901b is orientated along the northwest-to-southeast direction as is shown.

In accordance with the embodiment shown in FIG. 12, the second implantation 1128 is carried out as a 2-quad tilted implantation from north and south (with respect to the reference system provided by the compass rose 430). In accordance with this embodiment, the implantation direction of the second implantation 1128 is tilted with respect to both the sidewall normal and the longitudinal axis of the fin structure 901b of the protection field effect transistor 900b. In this way a complex dopant profile (for example, a dopant profile that has an asymmetric distribution of dopant species within the fin structure 901b) may be obtained. For example, a local shadowing effect of the source/drain regions 902b, 903b and of the gate region 904b may lead to a somewhat reduced dopant concentration in the regions 1250 of the fin structure 901b as shown in FIG. 12. The hatched regions 1251 in FIG. 12 represent schematically the variation of the dopant concentration in the sidewalls 901b" of the fin structure 901b in the longitudinal direction of the fin 901b.

In accordance with other embodiments, the protection field effect transistor 900b may be orientated at different angles on the substrate, that is, rotated by a rotation angle different from 45° and different from 90° with respect to the field effect transistor 900a to be protected. Also, the second implantation may be carried out from other directions, for example, by means of rotating the substrate and/or rotating the implantation apparatus, as described herein above. Furthermore, the tilt angle of the implantation (that is, the angle between the implantation vector and the surface normal 1131) may be varied in accordance with other embodiments.

In accordance with some embodiments of the invention, by applying tilted implants in the second implantation 1128 to the protection field effect transistor 900b rotated by an angle other than 90°, complex three-dimensional (3D) dopant profiles may be achieved in the field effect transistor 900b (for example, due to shadowing effects of the gate edge and/or of the edges of the source/drain regions).

In the embodiments described herein above in connection with FIG. 4A to FIG. 12, electronic circuits and manufacturing methods have been described, wherein a protection field effect transistor or an ESD robust field effect transistor of the electronic circuit has a different crystal orientation (FIG. 4A to FIG. 8) or a different dopant profile (FIG. 9 to FIG. 12) than a field effect transistor that is to be protected (e.g., a functional field effect transistor of the electronic circuit). By means of the difference in the crystal orientation or in the dopant profile of the transistors, different device properties or characteristics, for example, different ESD characteristics (e.g., different trigger voltages), may be obtained for the two transistors as described herein above.

In accordance with the exemplary embodiments shown in FIGS. 4A to 12, the protection field effect transistor and the field effect transistor to be protected have been shown to either have different crystal orientations or have different dopant profiles. In accordance with alternative embodiments, electronic circuits and corresponding manufacturing methods are provided, wherein the protection field effect transistor and the field effect transistor to be protected have both a different crystal orientation and a different dopant profile. In other words, in an electronic circuit in accordance with some embodiments, the protection field effect transistor (or the ESD robust field effect transistor) may have a different crystal orientation and a different dopant profile than the field effect transistor to be protected (e.g., the functional field effect transistor). Thus, in accordance with some embodiments, the effects of the difference in the crystal orientation and in the dopant profile may be combined. The difference in the crystal orientation and also the difference in the dopant profile may be achieved, for example, in accordance with any one of the embodiments described herein above.

FIG. 13 shows a method 1300 of manufacturing an electronic circuit in accordance with an embodiment of the invention.

In 1302, at least one field effect transistor that is to be protected against electrostatic discharge events is formed in or on a substrate.

In 1304, at least one protection field effect transistor is formed in or on the substrate. The field effect transistor to be protected and the protection field effect transistor are formed in such a manner that the protection field effect transistor has a crystal orientation that is different from a crystal orientation of the field effect transistor to be protected.

In accordance with one embodiment, at least one of the field effect transistor to be protected and the protection field effect transistor has a fin structure. In accordance with another embodiment, the field effect transistor to be protected and the protection field effect transistor are formed in or on a common crystalline region of the substrate, and the field effect transistor to be protected and the protection field effect transistor are orientated at different angles in or on the common crystalline region. In accordance with another embodiment, forming the field effect transistor to be protected and the protection field effect transistor includes forming one of the field effect transistor to be protected and the protection field effect transistor in or on the common crystalline region, rotating the substrate by a predefined rotation angle, and forming the other one of the field effect transistor to be protected and the protection field effect transistor in or on the common crystalline region. In accordance with another embodiment, the field effect transistor to be protected is formed in or on a first crystalline region of the substrate, the first crystalline region having a first crystal orientation, and the protection field effect transistor is formed in or on a second crystalline region of the substrate, the second crystalline region having a second crystal orientation different from the first crystal orientation. In accordance with another embodiment, the method further includes implanting first dopant implants at least into an extension region of the field effect transistor to be protected, and implanting second dopant implants at least into an extension region of the protection field effect transistor, wherein the implantation of the first and second dopant implants is carried out in such a manner that the extension region of the field effect transistor to be protected has a first dopant profile and that the extension region of the protection field effect transistor has a second dopant profile different from the first dopant profile. In accordance with another embodiment, the field effect transistor to be protected is configured as a functional field effect transistor. In accordance with another embodiment, the method further includes coupling the protection field effect transistor to the field effect transistor to be protected, to provide ESD protection thereof.

FIG. 14 shows a method 1400 of manufacturing an electronic circuit in accordance with another embodiment of the invention.

In 1402, at least one field effect transistor that is to be protected against electrostatic discharge events is formed in or on a substrate.

In 1404, at least one protection field effect transistor is formed in or on the substrate.

In 1406, first dopant implants are implanted at least into an extension region of the field effect transistor to be protected.

In 1408, second dopant implants are implanted at least into an extension region of the protection field effect transistor. The implantation of the first and second dopant implants is carried out in such a manner that the extension region of the field effect transistor to be protected has a first dopant profile and that the extension region of the protection field effect transistor has a second dopant profile different from the first dopant profile.

In accordance with one embodiment, the first dopant profile is achieved by means of implanting the first dopant implants from at least one first implantation direction into the extension region of the field effect transistor to be protected, and the second dopant profile is achieved by means of implanting the second dopant implants from at least one second implantation direction into the extension region of the protection field effect transistor, the at least one second implantation direction being different from the at least one first implantation direction. In accordance with some embodiments, implantation of the first and second dopant implants includes implanting the first dopant implants into the field effect transistor to be protected, rotating the substrate by a predefined rotation angle (for example, by a rotation angle of about 45° or of about 90° in one embodiment), and implanting the second dopant implants into the protection field effect transistor after the rotation of the substrate. In accordance with another embodiment, implantation of the first and second dopant implants includes the use of an implantation apparatus and further includes implanting the first dopant implants into the field effect transistor to be protected using the implantation apparatus, rotating the implantation device by a predefined rotation angle, and implanting the second dopant implants into the protection field effect transistor using the implantation apparatus and after the rotation of the implantation apparatus. In accordance with another embodiment, at least one of the first dopant profile and the second dopant profile is achieved by means of a tilted implantation. In accordance with another embodiment, at least one of the field effect transistor to be protected and the protection field effect transistor is formed such that it has a fin structure. In accordance with another embodiment, the at least one first implantation direction is perpendicular with respect to a longitudinal axis and tilted with respect to a sidewall normal of a fin structure of the field effect transistor to be protected, and the at least one second implantation direction is perpendicular with respect to a sidewall normal and tilted with respect to a longitudinal axis of a fin structure of the protection field effect transistor. In accordance with another embodiment, the at least one first implantation direction is perpendicular with respect to a longitudinal axis and tilted with respect to a sidewall normal of a fin structure of the field effect transistor to be protected, and the at least one second implantation direction is tilted with respect to both a sidewall normal and a longitudinal axis of a fin structure of the protection field effect transistor. In accordance with another embodiment, implantation of the first dopant implants or the second dopant implants or both includes an extension implantation. In accordance with another embodiment, the field effect transistors are formed in such a manner that the protection field effect transistor has a crystal orientation that is different from a crystal orientation of the field effect transistor to be protected.

Figure 15:
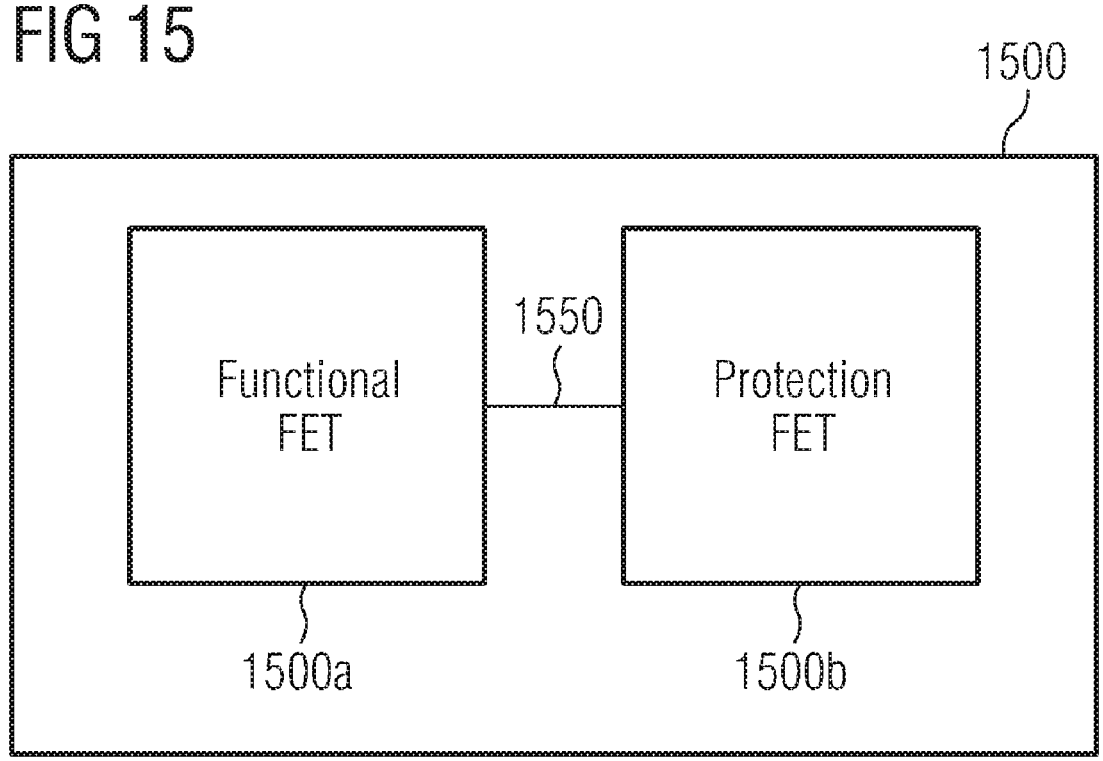
FIG. 15 shows an electronic circuit in accordance with another embodiment of the invention.

FIG. 15 shows an electronic circuit 1500 in accordance with another embodiment of the invention. The electronic circuit 1500 includes at least one functional field effect transistor 1500a having a first crystal orientation, and at least one protection field effect transistor 1500b, having a second crystal orientation that is different from the first crystal orientation. The protection field effect transistor 1500b is coupled to the functional field effect transistor 1500a (represented schematically by the line 1550 in FIG. 15) and protects the functional field effect transistor 1500a against electrostatic discharge events. In accordance with one embodiment, the functional field effect transistor 1500a is configured as a logic field effect transistor or as an input/output driver field effect transistor. In accordance with another embodiment, at least one of the functional field effect transistor 1500a and the protection field effect transistor 1500b has a fin structure. In accordance with another embodiment, the electronic circuit 1500 includes a substrate, wherein the functional field effect transistor 1500a and the protection field effect transistor 1500b are formed at different angles in or on a common crystalline region of the substrate. In accordance with another embodiment, an extension region of the functional field effect transistor 1500a has a first dopant profile, and an extension region of the protection field effect transistor 1500b has a second dopant profile different from the first dopant profile. In accordance with another embodiment, the first dopant profile is achieved by means of implanting first dopant implants from at least one first implantation direction into the extension region of the functional field effect transistor 1500a, and the second dopant profile is achieved by means of implanting second dopant implants from at least one second implantation direction into the extension region of the protection field effect transistor 1500b, the at least one second implantation direction being different from the at least one first implantation direction. In accordance with another embodiment, the at least one first implantation direction is perpendicular with respect to a longitudinal axis and tilted with respect to a sidewall normal of a fin structure of the functional field effect transistor 1500a, the at least one second implantation direction is perpendicular with respect to a sidewall normal and tilted with respect to a longitudinal axis of a fin structure of the protection field effect transistor 1500b. In accordance with another embodiment, the at least one first implantation direction is perpendicular with respect to a longitudinal axis and tilted with respect to a sidewall normal of a fin structure of the functional field effect transistor, and the at least one second implantation direction is tilted with respect to both a sidewall normal and a longitudinal axis of a fin structure of the protection field effect transistor 1500b.

Figure 16:
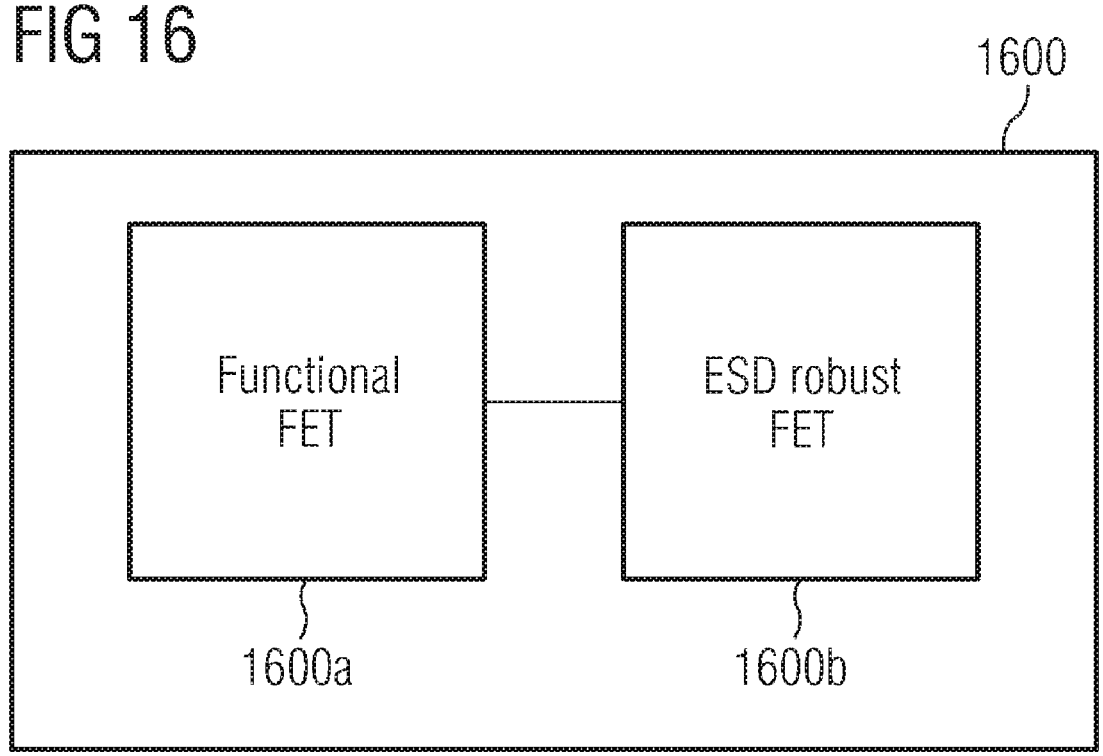
FIG. 16 shows an electronic circuit in accordance with another embodiment of the invention.

FIG. 16 shows an electronic circuit 1600 in accordance with another embodiment of the invention. The electronic circuit 1600 includes at least one functional field effect transistor 1600a and at least one ESD robust field effect transistor 1600b. In accordance with one embodiment, the ESD robust field effect transistor 1600b has a different crystal orientation than the functional field effect transistor 1600a. In accordance with another embodiment, an extension region of the functional field effect transistor has a first dopant profile, and an extension region of the ESD robust field effect transistor has a second dopant profile that is different from the first dopant profile. The first and second dopant profiles may be achieved in accordance with one of the embodiments described herein. In accordance with one embodiment, at least one of the functional field effect transistor 1600a and the ESD robust field effect transistor 1600b has a fin structure. In accordance with another embodiment, the electronic circuit includes a substrate, wherein the functional field effect transistor 1600a and the ESD robust field effect transistor 1600b are formed in or on a common crystalline region of the substrate, and are orientated at different angles in or on the common crystalline region. In accordance with another embodiment, the functional field effect transistor 1600a and the ESD robust field effect transistor 1600b are orientated in such a manner that a fin structure of the functional field effect transistor 1600a is rotated by a predetermined rotation angle with respect to a fin structure of the ESD robust field effect transistor 1600b, for example, by 90° or by 45° in accordance with some embodiments. In accordance with another embodiment, the functional field effect transistor 1600a is configured as a logic field effect transistor, and the ESD robust field effect transistor 1600b is configured as an ESD capable output driver field effect transistor.

An electronic circuit in accordance with another embodiment of the invention includes at least one field effect transistor that is to be protected against electrostatic discharge events, and at least one protection field effect transistor. An extension region of the field effect transistor to be protected has a first dopant profile, and an extension region of the protection field effect transistor has a second dopant profile that is different from the first dopant profile. In accordance with one embodiment, at least one of the field effect transistor to be protected and the protection field effect transistor has a fin structure. In accordance with another embodiment, at least one of the field effect transistor to be protected and the protection field effect transistor has a silicon-on-insulator structure. In accordance with another embodiment, the electronic circuit further includes a substrate, wherein the field effect transistor to be protected and the protection field effect transistor are formed on the substrate, and wherein the field effect transistor to be protected and the protection field effect transistor are orientated at different angles on the substrate. In accordance with another embodiment, the field effect transistor to be protected and the protection field effect transistor are orientated in such a manner that a fin structure of the field effect transistor to be protected is rotated by a rotation angle of 90° with respect to a fin structure of the protection field effect transistor. In accordance with another embodiment, the field effect transistor to be protected and the protection field effect transistor are orientated in such a manner that a fin structure of the field effect transistor to be protected is rotated by a rotation angle of 45° with respect to a fin structure of the protection field effect transistor. In accordance with another embodiment, the field effect transistor to be protected is configured as a functional field effect transistor. In accordance with another embodiment, the field effect transistor to be protected is configured as an input/output field effect transistor or as logic field effect transistor. In accordance with another embodiment, the protection field effect transistor is coupled to the field effect transistor to be protected, to provide ESD protection thereof. In accordance with another embodiment, the first dopant profile is achieved by means of implanting first dopant implants from at least one first implantation direction into the extension region of the field effect transistor to be protected, and the second dopant profile is achieved by means of implanting second dopant implants from at least one second implantation direction into the extension region of the protection field effect transistor, the at least one second implantation direction being different from the at least one first implantation direction. In accordance with another embodiment, at least one of the first dopant profile and the second dopant profile is achieved by means of a tilted implantation. In accordance with another embodiment, the at least one first implantation direction is perpendicular with respect to a longitudinal axis and tilted with respect to a sidewall normal of a fin structure of the field effect transistor to be protected, and the at least one second implantation direction is perpendicular with respect to a sidewall normal and tilted with respect to a longitudinal axis of a fin structure of the protection field effect transistor. In accordance with another embodiment, the at least one first implantation direction is perpendicular with respect to a longitudinal axis and tilted with respect to a sidewall normal of a fin structure of the field effect transistor to be protected, and the at least one second implantation direction is tilted with respect to both a sidewall normal and a longitudinal axis of a fin structure of the protection field effect transistor. In accordance with another embodiment, the field effect transistor to be protected has a crystal orientation that is different from a crystal orientation of the protection field effect transistor. In accordance with another embodiment, the electronic circuit further includes a substrate, wherein the field effect transistor to be protected is formed in or on a first crystalline region of the substrate, the first crystalline region having a first crystal orientation, and wherein the protection field effect transistor is formed in or on a second crystalline region of the substrate, the second crystalline region having a second crystal orientation different from the first crystal orientation.

An electronic circuit in accordance with another embodiment of the invention includes at least one field effect transistor that is to be protected against electrostatic discharge events, and at least one ESD protection field effect transistor. At least a portion of the field effect transistor to be protected, has a first implantation profile that is achieved by means of a first tilted implantation. At least a portion of the ESD protection field effect transistor has a second implantation profile that is achieved by means of a second tilted implantation. The first tilted implantation includes implanting first dopant implants from at least one first implantation direction into the field effect transistor to be protected, and the second tilted implantation includes implanting second dopant implants from at least one second implantation direction into the ESD protection field effect transistor, the at least one second implantation direction being different from the at least one first implantation direction. In accordance with one embodiment, at least one of the field effect transistor to be protected and the ESD protection field effect transistor has a fin structure. In accordance with another embodiment, the at least one first implantation direction is perpendicular with respect to a longitudinal axis and tilted with respect to a sidewall normal of a fin structure of the field effect transistor to be protected, and the at least one second implantation direction is perpendicular with respect to a sidewall normal and tilted with respect to a longitudinal axis of a fin structure of the ESD protection field effect transistor. In accordance with another embodiment, the at least one first implantation direction is perpendicular with respect to a longitudinal axis and tilted with respect to a sidewall normal of a fin structure of the field effect transistor to be protected, and the at least one second implantation direction is tilted with respect to both a sidewall normal and a longitudinal axis of a fin structure of the ESD protection field effect transistor.

An electronic circuit in accordance with another embodiment of the invention includes at least one field effect transistor that is to be protected against electrostatic discharge events, the field effect transistor being formed along a first crystal orientation in a first semiconductor material. The electronic circuit further includes at least one protection field effect transistor, the protection field effect transistor being formed along a second crystal orientation in a second semiconductor material, wherein the first and second crystal orientations are different. In accordance with some embodiments, the first semiconductor material and the second semiconductor material are the same material, for example, bulk silicon or silicon-on-insulator in accordance with some embodiments. In accordance with one embodiment, at least one of the field effect transistor to be protected and the protection field effect transistor may be configured as a fin field effect transistor or as a multigate field effect transistor. In this case, a fin structure of the field effect transistor to be protected may be orientated with its longitudinal axis along the first crystal orientation and/or a fin structure of the protection field effect transistor may be orientated with its longitudinal axis along the second crystal orientation. In accordance with another embodiment, at least one of the field effect transistor to be protected and the protection field effect transistor may be configured as an SOI field effect transistor.

An electronic circuit in accordance with another embodiment of the invention includes at least one field effect transistor that is to be protected against electrostatic discharge events, a body region of the field effect transistor being formed along a first crystal orientation in a first semiconductor material. The electronic circuit further includes at least one protection field effect transistor, a body region of the protection field effect transistor being formed along a second crystal orientation in a second semiconductor material, wherein the first and second crystal orientations are different. In accordance with some embodiments, the first semiconductor material and the second semiconductor material are the same material, for example, bulk silicon or silicon-on-insulator in accordance with some embodiments. The term "body region" may be understood to mean the physical part of a transistor between the source region and the drain region of the transistor. In accordance with one embodiment, at least one of the field effect transistor to be protected and the protection field effect transistor may be configured as a fin field effect transistor or as a multigate field effect transistor. In accordance with another embodiment, at least one of the field effect transistor to be protected and the protection field effect transistor may be configured as an SOI field effect transistor.

In the following, additional features and effects of exemplary embodiments of the invention are described.

In accordance with some embodiments of the invention, electronic circuits and corresponding manufacturing methods are provided, by means of which the design window for ESD protection in FinFET or MuGFET integrated circuits may be enlarged.

In accordance with some embodiments, the maximum voltage level in an electronic circuit based on FinFET technology is pushed to higher values. One effect thereof is an increased freedom in the design of ESD protection.

In accordance with some embodiments, electronic circuits are provided wherein a field effect transistor (e.g., FinFET) device to be protected (e.g., an I/O driver) and an ESD protection device are orientated at different angles on a chip. In accordance with some embodiments, the term "different angle" implies the use of different wafer or crystal orientations for the transistors and/or the formation of different dopant profiles (e.g., by means of tilted implants) in the transistors.

In accordance with some embodiments, by rotating FinFET devices by a certain degree a significant increase of the triggering voltage level (that is, the voltage level where the device starts carrying current) is obtained. This effect can directly be used to increase the ESD design window. For example, in accordance with one embodiment, in output buffers, which are directly connected to an external pin and thus subject to ESD, devices turned by 45° can be used to increase the ESD design window.

In accordance with some embodiments, ESD protection devices are provided that have a different orientation on the substrate than a device to be protected. These protection devices have a lower ESD triggering voltage and may thus ensure that the protection devices will trigger first (that is, before the devices to be protected) during an ESD event.

In accordance with embodiments of the invention, the difference in triggering voltage with device orientation is due to the difference in the silicon crystal orientation and/or the difference in the way the fin structures (fins) of N-type or P-type FinFET devices receive an implantation.

In accordance with some embodiments, a doping profile difference may be obtained in a device that is rotated by a predetermined rotation angle with respect to a reference orientation.

In accordance with one embodiment, tilted implants that are conventionally used to dope the fin sidewalls of a standard FinFET device are used to dope an ESD device that is rotated by a rotation angle of 90°. Thus, for the rotated ESD device, a more abrupt and/or in some parts more curved doping profile may be obtained by the same implants now hitting only (or almost only) the upper surface of the fin but not the sidewalls of the fin. A consequence thereof may be a lower ESD trigger voltage of the rotated ESD device compared to a non-rotated device, and thus a preferred current path through the ESD device during an ESD event.

In accordance with some embodiments, any orientation difference ("orientation angle") between the ESD device and the protected device may be chosen.

In accordance with another embodiment, separate masks may be used for the tilted implant (e.g., used as extension implants) and source/drain implants, thus allowing larger device portions to receive the tilted implant (rotated and non-rotated device) for a stronger electrical differentiation between the ESD device and the protected device.

In accordance with another embodiment, a region of "extension-only" may be defined by a mask and not only by a spacer. Thus, a more pronounced difference between an ESD and a standard device may be achieved, for example.

In accordance with one embodiment, by applying tilted implants to a device rotated by an angle other than 90°, complex three-dimensional (3D) dopant profiles may be achieved (e.g., due to shadowing effects of the implants at the edges of the gate stack). One effect thereof may be an additional improvement of the triggering characteristics of the ESD device. For example, a more inhomogeneous dopant profile may be achieved in the ESD device which may lead to an earlier breakthrough of that device.

In accordance with some embodiments, processing and lithography differences depending on the device orientation may also be utilized for an electrical distinction between ESD and standard devices.

In accordance with some embodiments, different breakdown and/or different punch-through bipolar properties are exploited in an ESD device. In accordance with one embodiment, these different properties are the result of 3D distorted dopant profiles in the ESD device, which may be obtained by using a tilted ion implantation and a rotated device orientation such that complex shadowing effects may occur in the implantation.

In accordance with one embodiment of the invention, an electronic circuit is provided that includes a functional field effect transistor and a field effect transistor with ESD capability (in other words, an ESD capable field effect transistor), wherein the functional field effect transistor has a first orientation and the ESD field effect transistor has a second orientation different from the first orientation. Clearly, the orientation of a functional field effect transistor of the electronic circuit provides a reference device orientation, and the orientation of an ESD capable field effect transistor is rotated with respect to the reference device orientation.

In accordance with some embodiments, the term "functional field effect transistor" is to be understood as denoting, for example, logic field effect transistor devices (that is, devices used to perform logic operations or build up logic gates, e.g., core logic transistors) or driver field effect transistor devices (that is, devices that may provide a "drive" current, e.g., input/output drivers). Clearly, the functional field effect transistor may be configured as an ESD-protected driver in accordance with an embodiment.

In accordance with some embodiments, the term "ESD capable field effect transistor" or "ESD robust field effect transistor" is to be understood as denoting, for example, ESD protection field effect transistor devices (that is, devices used to protect other devices against electrostatic discharge events) or ESD capable output driver devices (that is, driver devices with ESD capability or robustness, in other words, ESD self-protective driver devices).

In accordance with some embodiments, an ESD protection field effect transistor is electrically coupled to the functional field effect transistor (for example, to a logic field effect transistor) to provide ESD protection thereof.

An effect of some embodiments of the invention is, that by rotating an ESD device with respect a logic device of an electronic circuit, the ESD performance of the ESD device may be improved. One reason for the improved ESD performance may be seen in a difference in the crystal orientation between the rotated and the non-rotated device. Another reason for the improved ESD performance may be seen in a difference in the doping profile between the rotated and the non-rotated device, e.g., in a difference in the doping gradient.

In accordance with some embodiments, the field effect transistor device (e.g., a logic device) to be protected and the ESD protection device are located in the same region of a substrate having a given crystal orientation.

In accordance with some embodiments, the substrate may be a bulk wafer or a silicon-on-insulator (SOI) wafer. In other words, a bulk technology or an SOI technology may be applied, for example.

In accordance with one embodiment, at least one of the field effect transistors of the electronic circuit may be configured as fin field effect transistor (FinFET) or multi-gate field effect transistor (MuGFET) devices. Alternatively, one or more of the field effect transistors may be configured as planar devices.

In accordance with one embodiment, the field effect transistors of the electronic circuit are configured as FinFET devices on an SOI substrate or wafer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic circuit, comprising:
    at least one field effect transistor in or on a substrate that is to be protected against electrostatic discharge events; and
    at least one protection field effect transistor in or on a substrate,
    wherein the field effect transistor to be protected is oriented along a first orientation on the substrate, and the protection field effect transistor is oriented along a second orientation on the substrate that is different from the first orientation.

2. The electronic circuit as claimed in claim 1, wherein the field effect transistor to be protected is configured as a functional field effect transistor.

3. The electronic circuit as claimed in claim 1, wherein the protection field effect transistor is coupled to the field effect transistor to be protected, to provide LSD protection thereof.

4. The electronic circuit as claimed in claim 1, wherein at least one of the field effect transistor to be protected and/or the protection field effect transistor comprises a fin structure.

5. The electronic circuit as claimed in claim 1, wherein at least one of the field effect transistor to be protected and/or the protection field effect transistor comprises a silicon-on-insulator structure.

6. The electronic circuit as claimed in claim 1, wherein the field effect transistor to be protected is formed along a first crystal orientation in a first semiconductor material, wherein the protection field effect transistor is formed along a second crystal orientation in a second semiconductor material, and wherein the first and second crystal orientations are different.

7. The electronic circuit as claimed in claim 1, wherein the field effect transistor to be protected and the protection field effect transistor are formed in or on a common crystalline region of the substrate, and wherein the field effect transistor to be protected and the protection field effect transistor are orientated at different angles in or on the common crystalline region.

8. The electronic circuit as claimed in claim 1, wherein the field effect transistor to be protected is formed in or on a first crystalline region of the substrate, the first crystalline region comprising a first crystal orientation, and wherein the protection field effect transistor is formed in or on a second crystalline region of the substrate, the second crystalline region comprising a second crystal orientation different from the first crystal orientation.

9. The electronic circuit as claimed in claim 4, wherein an extension region of the field effect transistor to be protected comprises a first dopant profile, and wherein an extension region of the protection field effect transistor comprises a second dopant profile different from the first dopant profile.

10. The electronic circuit as claimed in claim 9, wherein the first dopant profile is achieved by means of implanting first dopant implants from at least one first implantation direction into the extension region of the field effect transistor to be protected, and wherein the second dopant profile is achieved by means of implanting second dopant implants from at least one second implantation direction into the extension region of the protection field effect transistor, the at least one second implantation direction being different from the at least one first implantation direction.

11. An electronic circuit, comprising:
at least one functional field effect transistor in or on a substrate; and
at least one ESD robust field effect transistor in or on a substrate,
wherein the functional field effect transistor is oriented along a first orientation on the substrate, and the ESD robust field effect transistor is oriented along a second orientation on the substrate that is different from the first orientation.

12. A method of manufacturing an electronic circuit, the method comprising:
forming at least one field effect transistor that is to be protected against electrostatic discharge events the at least one field effect transistor being formed in or on a substrate; and
forming at least one protection field effect transistor in or on the substrate, wherein the field effect transistor to be protected and the protection field effect transistor are formed in such a manner that the field effect transistor to be protected is oriented along a first orientation on the substrate and the protection field effect transistor is oriented along a second orientation on the substrate that is different from the first orientation.

13. The method as claimed in claim 12, wherein at least one of the field effect transistor to be protected and/or the protection field effect transistor comprises a fin structure.

14. The method as claimed in claim 12, wherein the field effect transistor to be protected and the protection field effect transistor are formed in or on a common crystalline region of the substrate, and wherein the field effect transistor to be protected and the protection field effect transistor are orientated at different angles in or on the common crystalline region.

15. The method as claimed in claim 12, wherein the field effect transistor to be protected is formed in or on a first crystalline region of the substrate, the first crystalline region comprising a first crystal orientation, and wherein the protection field effect transistor is formed in or on a second crystalline region of the substrate, the second crystalline region comprising a second crystal orientation different from the first crystal orientation.

16. The method as claimed in claim 13, further comprising:
implanting first dopant implants at least into an extension region of the field effect transistor to be protected; and
implanting second dopant implants at least into an extension region of the protection field effect transistor;
wherein the implantation of the first and second dopant implants is carried out in such a manner that the extension region of the field effect transistor to be protected comprises a first dopant profile and that the extension region of the protection field effect transistor comprises a second dopant profile different from the first dopant profile.

17. An electronic circuit, comprising:
at least one field effect transistor in or on a substrate that is to be protected against electrostatic discharge events; and
at least one protection field effect transistor in or on a substrate;
wherein an extension region of the field effect transistor to be protected comprises a first dopant profile, and wherein an extension region of the protection field effect transistor comprises a second dopant profile that is different from the first dopant profile; and
wherein the field effect transistor to be protected is oriented along a first orientation on the substrate, and the protection field effect transistor is oriented along a second orientation on the substrate that is different from the first orientation.

18. The electronic circuit as claimed in claim 17, wherein at least one of the field effect transistor to be protected and/or the protection field effect transistor comprises a fin structure.

19. The electronic circuit as claimed in claim 17,
wherein the first dopant profile is achieved by means of implanting first dopant implants from at least one first implantation direction into the extension region of the field effect transistor to be protected; and
wherein the second dopant profile is achieved by means of implanting second dopant implants from at least one second implantation direction into the extension region of the protection field effect transistor, the at least one second implantation direction being different from the at least one first implantation direction.

20. The electronic circuit as claimed in claim 17, wherein the field effect transistor to be protected comprises a crystal orientation that is different from a crystal orientation of the protection field effect transistor.

21. A method of manufacturing an electronic circuit, the method comprising:
forming at least one field effect transistor that is to be protected against electrostatic discharge events, in or on a substrate;
forming at least one protection field effect transistor in or on the substrate;
implanting first dopant implants at least into an extension region of the field effect transistor to be protected; and
implanting second dopant implants at least into an extension region of the protection field effect transistor;
wherein the implantation of the first and second dopant implants is carried out in such a manner that the extension region of the field effect transistor to be protected comprises a first dopant profile and that the extension region of the protection field effect transistor comprises a second dopant profile different from the first dopant profile; and wherein the field effect transistor to be protected and the protection field effect transistor are formed in such a manner that the field effect transistor to be protected is oriented along a first orientation on the substrate and the protection field effect transistor is oriented along a second orientation on the substrate that is different from the first orientation.

22. The method as claimed in claim 21, wherein the first dopant profile is achieved by means of implanting the first dopant implants from at least one first implantation direction into the extension region of the field effect transistor to be protected; and wherein the second dopant profile is achieved by means of implanting the second dopant implants from at least one second implantation direction into the extension region of the protection field effect transistor, the at least one second implantation direction being different from the at least one first implantation direction.

23. The method as claimed in claim 21, wherein at least one of the field effect transistor to be protected and the protection field effect transistor comprises a fin structure.

24. The method as claimed in claim 23, wherein the at least one first implantation direction is perpendicular with respect to a longitudinal axis and tilted with respect to a sidewall normal of a fin structure of the field effect transistor to be protected; and wherein the at least one second implantation direction is perpendicular with respect to a sidewall normal and tilted with respect to a longitudinal axis of a fin structure of the protection field effect transistor, or is tilted with respect to both the sidewall normal and the longitudinal axis of the fin structure of the protection field effect transistor.

25. The method as claimed in claim 21, wherein the field effect transistors are formed in such a manner that the protection field effect transistor comprises a crystal orientation that is different from a crystal orientation of the field effect transistor to be protected.

* * * * *

UNITED STATES PATENT AND TRADEMARK OFFICE
CERTIFICATE OF CORRECTION

PATENT NO. : 7,687,859 B2 Page 1 of 1
APPLICATION NO. : 11/852068
DATED : March 30, 2010
INVENTOR(S) : Russ et al.

It is certified that error appears in the above-identified patent and that said Letters Patent is hereby corrected as shown below:

In Col. 30, line 56, Claim 3, delete "LSD" and insert --ESD--.

Signed and Sealed this

Twenty-ninth Day of June, 2010

David J. Kappos
*Director of the United States Patent and Trademark Office*